(12) United States Patent
Sako

(10) Patent No.: US 11,107,542 B2
(45) Date of Patent: Aug. 31, 2021

(54) SEMICONDUCTOR MEMORY DEVICE

(71) Applicant: TOSHIBA MEMORY CORPORATION, Tokyo (JP)

(72) Inventor: Mario Sako, Yokohama Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 184 days.

(21) Appl. No.: 16/552,813

(22) Filed: Aug. 27, 2019

(65) Prior Publication Data
US 2020/0202964 A1 Jun. 25, 2020

(30) Foreign Application Priority Data

Dec. 21, 2018 (JP) .............................. JP2018-239999

(51) Int. Cl.
| | |
|---|---|
| *G11C 16/34* | (2006.01) |
| *G11C 16/08* | (2006.01) |
| *G11C 16/10* | (2006.01) |
| *G11C 16/26* | (2006.01) |
| *G11C 16/04* | (2006.01) |
| *G11C 11/56* | (2006.01) |

(Continued)

(52) U.S. Cl.
CPC ...... *G11C 16/3459* (2013.01); *G11C 11/5628* (2013.01); *G11C 11/5642* (2013.01); *G11C 11/5671* (2013.01); *G11C 16/0483* (2013.01); *G11C 16/08* (2013.01); *G11C 16/10* (2013.01); *G11C 16/26* (2013.01); *G11C 2211/5621* (2013.01); *H01L 27/11556* (2013.01); *H01L 27/11582* (2013.01)

(58) Field of Classification Search
CPC ..... G11C 16/3459; G11C 16/08; G11C 16/10; G11C 16/26; G11C 16/0483; G11C 11/5642; G11C 11/5671; G11C 11/5628; G11C 2211/5621; G11C 16/24; G11C 16/32; H01L 27/11582; H01L 27/11556
See application file for complete search history.

(56) References Cited

U.S. PATENT DOCUMENTS 9,779,832 B1 * 10/2017 Masuduzzaman ........................ G11C 11/5642
10,109,359 B2  10/2018 Iwai et al.
(Continued)

FOREIGN PATENT DOCUMENTS

JP  2010134984 A  6/2010

*Primary Examiner* — Mohammed A Bashar
(74) *Attorney, Agent, or Firm* — Kim & Stewart LLP

(57) ABSTRACT

A semiconductor memory device includes a word line connected to memory cells, bit lines respectively connected to the memory cells, and a control circuit configured to control voltages applied to the word line and the bit lines during a write operation. When writing data into a target memory cell, the control circuit executes first and second loops in sequence. In executing the first loop, the control circuit applies a first program voltage to the word line during the program operation, and applies a verify voltage to the word line during the verify operation, and upon detecting that the verify operation neither passed nor failed, the control circuit selects one of two pass write voltages to be applied to the bit line connected to the target memory cell during the program operation of the second loop according to a sequential position of the first loop in the sequence of loops.

20 Claims, 28 Drawing Sheets

(51) Int. Cl.
*H01L 27/11582* (2017.01)
*H01L 27/11556* (2017.01)

(56) References Cited

U.S. PATENT DOCUMENTS

2010/0097863 A1* 4/2010 Kim .................. G11C 16/0483
                                                                          365/185.18
2011/0007571 A1* 1/2011 Park ................... G11C 11/5628
                                                                          365/185.22

* cited by examiner

SEMICONDUCTOR MEMORY DEVICE

CROSS-REFERENCE TO RELATED APPLICATION(S)

This application is based upon and claims the benefit of priority from Japanese Patent Application No. 2018-239999, filed Dec. 21, 2018, the entire contents of which are incorporated herein by reference.

FIELD

Embodiments described herein relate generally to a semiconductor memory device.

BACKGROUND

In a NAND type FLASH memory, a memory cell may be programmed not only as an SLC (Single-Level Cell), in which 1-bit (binary) data is stored, but also as an MLC (Multi-Level Cell), in which 2-bit (4-level) data is stored, a TLC (Triple-Level Cell), in which 3-bit (8-level) data is stored, or a QLC (Quad-Level Cell), in which 4-bit (16-level) data is stored.

When the memory cell stores multileveled data as described above, it is required to narrow the width of a threshold voltage distribution of the memory cell. A write method called QPW (Quick Pass Write) may be employed to narrow the width of the threshold voltage distribution of the memory cell. The QPW narrows the threshold voltage distribution by applying a QPW voltage to a bit line connected to the memory cell. By increasing the QPW voltage, it is possible to narrow the width of the threshold voltage distribution.

However, when the QPW voltage is excessively increased, the number of programming loops that has to be executed until the threshold voltage of a memory cell transistor reaches a desired level, increases.

DETAILED DESCRIPTION

Embodiments provide a semiconductor memory device capable of narrowing the width of a threshold voltage distribution while preventing an increase in time required for data write operation.

In general, according to one embodiment, a semiconductor memory device includes a memory cell array including a plurality of memory cells, a word line connected to gates of the plurality of memory cells, a word line driver configured to apply a program voltage to the word line during a program operation of a write operation to write data into the plurality of memory cells and to apply a verify voltage to the word line during a verify operation of the write operation, a plurality of bit lines connected to the plurality of memory cells, respectively, a sense amplifier circuit configured to apply a bit line voltage to the plurality of bit lines during the program operation and to detect the data written into the plurality of memory cells via the plurality of bit lines during the verify operation, and a control circuit configured to control the word line driver and the sense amplifier circuit to execute the write operation in a plurality of loops executed in sequence, the program voltage being increased for each subsequent loop of the write operation. When writing first data into a target memory cell connected to the word line, the control circuit executes at least first and second loops in sequence. In executing the first loop, the control circuit applies a first program voltage to the word line during the program operation, and applies a verify voltage corresponding to the first data to the word line during the verify operation, and upon detecting that the verify operation in the first loop neither passed nor failed, the control circuit selects one of at least two pass write voltages to be applied to the bit line connected to the target memory cell during the program operation of the second loop according to a sequential position of the first loop in the sequence of the plurality of loops.

Hereinafter, embodiments of the present disclosure will be described in detail with reference to the drawings.

According to the embodiments, it is possible to sufficiently narrow the width of a threshold voltage distribution of a memory cell while preventing an increase in the total time required for the write operation, by utilizing a pass write effect (described below) in a flexible manner.

(Configuration of Memory System)

Figure 1:
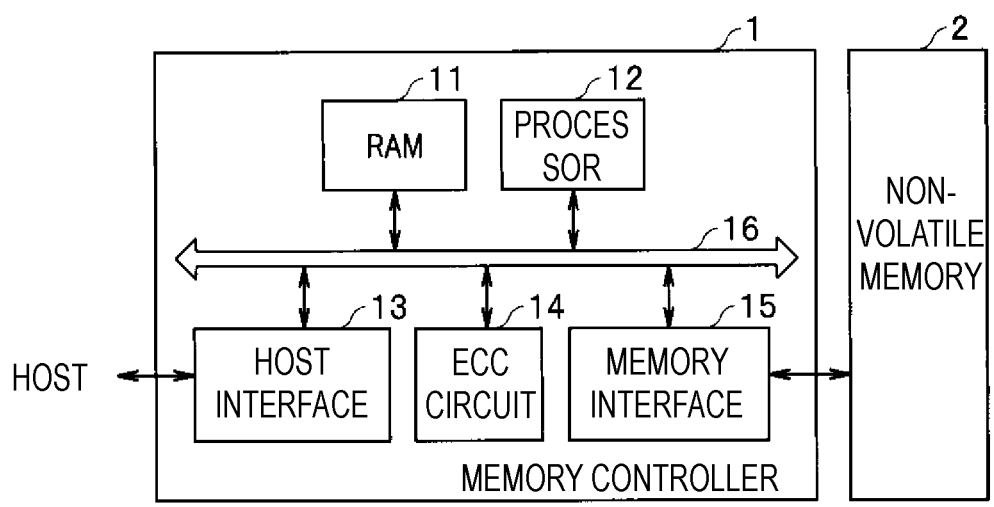
FIG. 1 is a block diagram illustrating an example of a configuration of a memory system according to an embodiment.

FIG. 1 is a block diagram illustrating an example of the configuration of a memory system according to an embodiment. The memory system of the present embodiment includes a memory controller 1 and a nonvolatile memory 2. The memory system may be accessed by a host. The host is, for example, an electronic apparatus such as a personal computer or a portable terminal.

The nonvolatile memory 2 is a semiconductor memory device that stores data in a nonvolatile manner, and includes, for example, a NAND flash memory. In the present embodiment, descriptions will be made assuming that the nonvolatile memory 2 is a NAND memory having memory cells, in which 4 bits are stored per memory cell, that is, a NAND memory of 4 bits/cell (QLC: Quad-Level Cell). The nonvolatile memory 2 is formed in three dimensions.

The memory controller 1 controls writing of data into the nonvolatile memory 2 according to a write request from the host. Further, the memory controller 1 controls reading of data from the nonvolatile memory 2 according to a read request from the host. The memory controller 1 includes a random access memory (RAM) 11, a processor 12, a host interface 13, an ECC (Error Check and Correct) circuit 14, and a memory interface 15. The RAM 11, the processor 12, the host interface 13, the ECC circuit 14, and the memory interface 15 are interconnected by an internal bus 16.

The host interface 13 outputs a request received from the host, write data as user data, and the like to the internal bus 16. Further, the host interface 13 transmits user data read from the nonvolatile memory 2, a response from the processor 12, and the like to the host.

Based on instructions from the processor 12, the memory interface 15 controls a process of writing user data and the like into the nonvolatile memory 2 and a process of reading user data and the like from the nonvolatile memory 2.

The processor 12 controls the memory controller 1. The processor 12 is, for example, a CPU (Central Processing Unit), an MPU (Micro Processing Unit) or the like. When a request is received from the host via the host interface 13, the processor 12 performs a control in accordance with the request. For example, the processor 12 instructs the memory interface 15 to write user data and parity into the nonvolatile memory 2 according to a write request from the host. In addition, the processor 12 instructs the memory interface 15 to read user data and parity from the nonvolatile memory 2 according to a read request from the host.

The processor 12 determines a storage area (hereinafter, referred to as a memory area) on the nonvolatile memory 2 for user data stored in the RAM 11. The user data is stored in the RAM 11 via the internal bus 16. The processor 12 determines the memory area in units of a page (e.g., one page of data), which is a unit of writing. In the descriptions provided herein, the user data stored in one page of the nonvolatile memory 2 is defined as unit data. The unit data is, for example, encoded and stored as a code word in the nonvolatile memory 2.

In addition, the encoding may not be necessarily required. The memory controller 1 may store the unit data in the nonvolatile memory 2 without performing the encoding. However, FIG. 1 illustrates a configuration in which the encoding is performed, as an example. When the memory controller 1 does not perform the encoding, the page data matches the unit data. In addition, one code word may be generated based on one unit data, and one code word may be generated based on divided data of the unit data. Further, one code word may be generated using a plurality of pieces of unit data.

The processor 12 determines the memory area of the nonvolatile memory 2 of a write destination for each unit data. A physical address is assigned to the memory area of the nonvolatile memory 2. The processor 12 uses the physical address to manage the memory area of the write destination of the unit data. The processor 12 designates the physical address of the determined memory area and instructs the memory interface 15 to write the user data into the nonvolatile memory 2. The processor 12 manages the correspondence between a logical address of the user data (logical address managed by the host) and the physical address. When a read request including a logical address is received from the host, the processor 12 determines a physical address corresponding to the logical address, designates the physical address, and instructs the memory interface 15 to read the user data.

The ECC circuit 14 encodes the user data stored in the RAM 11 to generate a code word. In addition, the ECC circuit 14 decodes the code word read from the nonvolatile memory 2. The RAM 11 temporarily stores the user data received from the host before storing the user data in the nonvolatile memory 2, or temporarily stores the data read from the nonvolatile memory 2 before transmitting the data to the host. The RAM 11 is, for example, a general-purpose memory such as a SRAM (Static Random Access Memory) or a DRAM (Dynamic Random Access Memory).

FIG. 1 illustrates an example of a configuration in which the memory controller 1 includes the ECC circuit 14 and the memory interface 15 as separate components. However, the ECC circuit 14 may be incorporated in the memory interface 15. Further, the ECC circuit 14 may be incorporated in the nonvolatile memory 2.

When a write request is received from the host, the memory controller 1 operates as follows. The processor 12 temporarily stores the write data in the RAM 11. The processor 12 reads the data stored in the RAM 11 and inputs the data to the ECC circuit 14. The ECC circuit 14 encodes the input data into a code word and inputs the code word to the memory interface 15. The memory interface 15 writes the code word into the nonvolatile memory 2.

When a read request is received from the host, the memory controller 1 operates as follows. The memory interface 15 inputs the code word read from the nonvolatile memory 2 to the ECC circuit 14. The ECC circuit 14 decodes the code word and stores the decoded data in the RAM 11. The processor 12 transmits the data stored in the RAM 11 to the host via the host interface 13.

Figure 2:
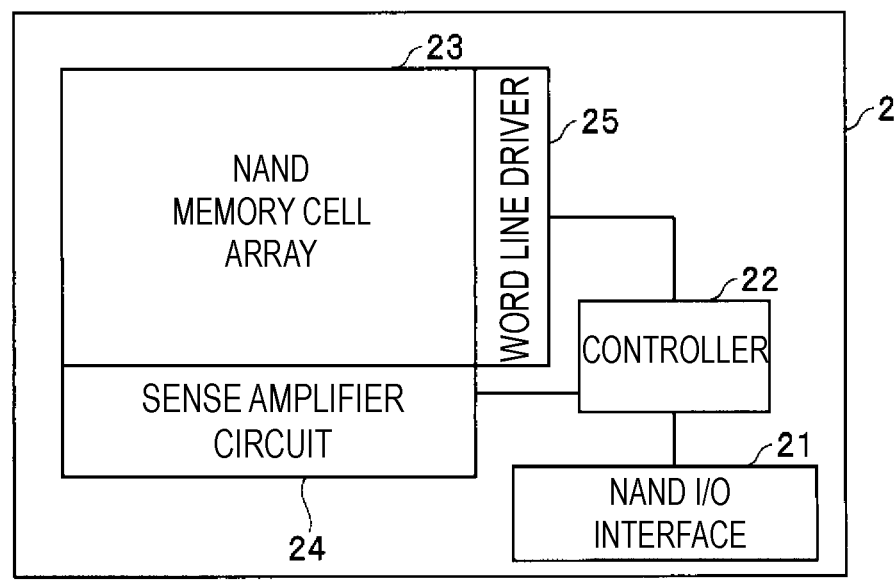
FIG. 2 is a block diagram illustrating an example of a configuration of a nonvolatile memory according to an embodiment.

FIG. 2 is a block diagram illustrating an example of the configuration of the nonvolatile memory according to the present embodiment. The nonvolatile memory 2 includes an NAND I/O interface 21, a controller 22, an NAND memory cell array 23, a sense amplifier circuit 24, and a word line driver 25. The nonvolatile memory 2 is formed on, for example, a one-chip semiconductor substrate (e.g., a silicon substrate).

The NAND I/O interface 21 receives control signals such as a write enable signal WEn, a read enable signal REn, an address latch enable signal ALE, a command latch enable signal CLE and the like output from the memory controller 1. Further, the NAND I/O interface 21 receives commands, addresses, and data output from the memory controller 1.

The controller (which is a control circuit) 22 receives the control signals, commands, addresses, and data from the NAND I/O interface 21, and controls the operation of the nonvolatile memory 2 based on the control signals, commands, addresses, and data. For example, based on the control signals, commands, addresses, and data, the controller 22 controls the word line driver 25 and the sense amplifier circuit 24 to execute a write operation, a read operation, an erase operation and the like.

When a write command is input, the controller 22 controls the sense amplifier circuit 24 and the word line driver 25 to write data input along with the write command to a designated address in the NAND memory cell array 23. Further, when a read command is input, the controller 22 controls the sense amplifier circuit 24 and the word line driver 25 to read data from a designated address in the NAND memory cell array 23.

For example, in order to write data into a memory cell (memory cell transistor) MT in the NAND memory cell array 23, the controller 22 controls a voltage applied to a plurality of word lines WL by the word line driver 25 or a voltage applied to a plurality of bit lines BL (bit line voltage) by the sense amplifier circuit 24.

The sense amplifier circuit 24 is configured to be able to independently apply a voltage (or current) to the plurality of bit lines BL, and independently detect a voltage (or a current) of the plurality of bit lines BL.

The word line driver 25 is configured to be able to independently apply a voltage to the plurality of word lines and select gate lines.

(Configuration of NAND Memory Cell Array)

Figure 3:
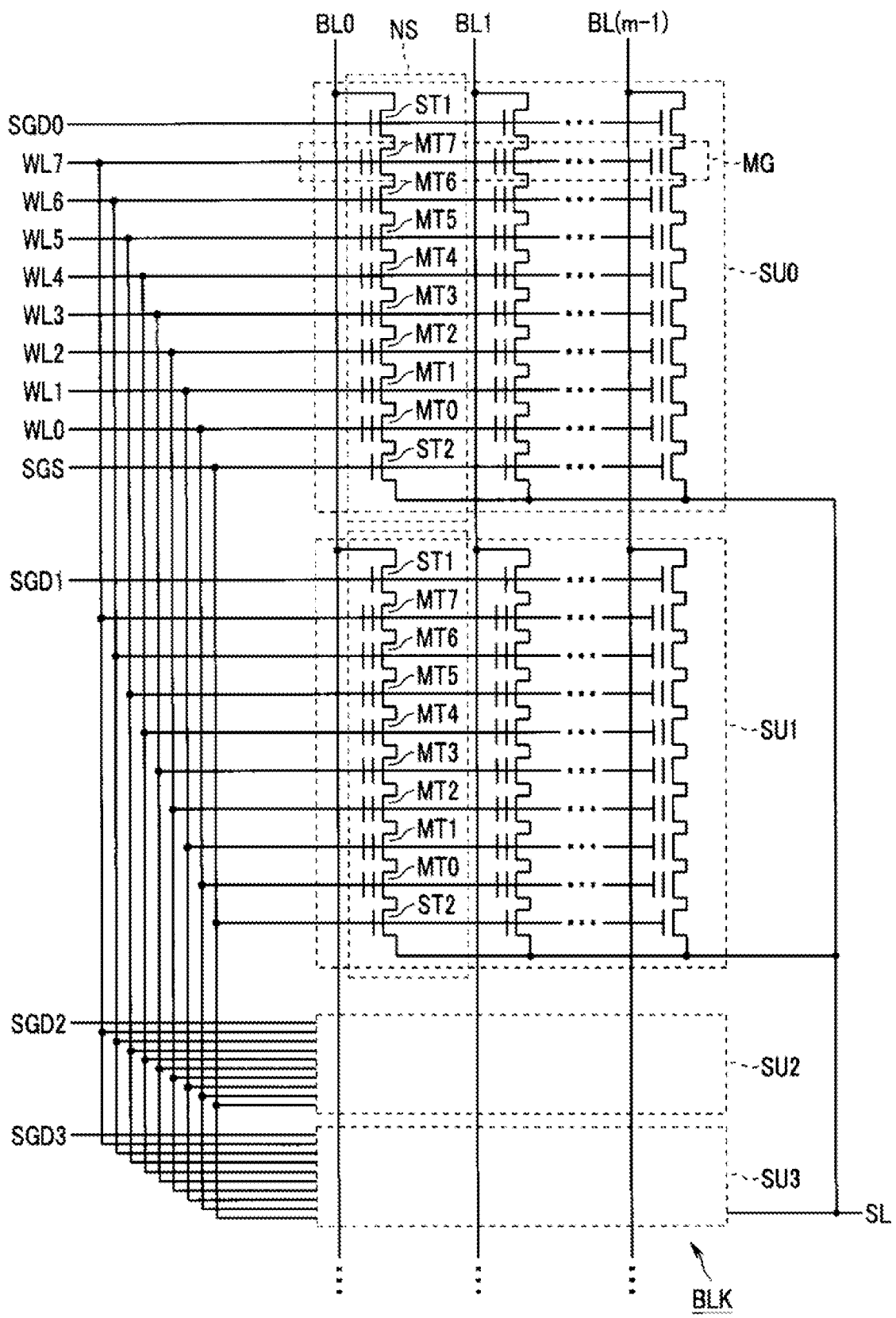
FIG. 3 is a view illustrating an example of a configuration of blocks of a three-dimensional NAND memory cell array according to an embodiment.

FIG. 3 is a view illustrating an example of a configuration of blocks of the three-dimensional NAND memory cell array 23. FIG. 3 illustrates one block BLK among a plurality of blocks that make up the three-dimensional NAND memory cell array (hereinafter, referred to as a memory cell array) 23. The other blocks of the memory cell array also have the same configuration as that illustrated in FIG. 3. The present embodiment is also applicable to a two-dimensional memory cell array.

As illustrated, the block BLK includes, for example, four string units (SU0 to SU3). Each string unit SU includes a plurality of NAND strings NS. Each NAND string NS includes eight memory cells MT (MT0 to MT7) and select transistors ST1 and ST2. Here, the number of memory cells MT in the NAND string NS is eight. However, the number of memory cells MT is not limited to eight, and may be, for example, 32, 48, 64, or 96. Each of the select transistors ST1 and ST2 is illustrated as one transistor in the electric circuit, but may have the same structure as the memory cell transistor. Further, for example, in order to improve the cutoff characteristic, a plurality of select transistors may be used as each of the select transistors ST1 and ST2. In addition, dummy cell transistors may be provided between the memory cells MT and the select transistors ST1 and ST2.

The memory cells MT are arranged to be connected in series between the select transistors ST1 and ST2. The memory cell MT7 at one end is connected to the select transistor ST1, and the memory cell MT0 at the other end is connected to the select transistor ST2.

The gates of the select transistors ST1 of the respective string units SU0 to SU3 are connected in common to select gate lines SGD0 to SGD3, respectively. Meanwhile, the gates of the select transistors ST2 are connected in common to the same select gate line SGS across the plurality of string units SU in the same block BLK. In addition, the gates of the memory cells MT0 to MT7 in the same block BLK are connected in common to word lines WL0 to WL7, respectively. That is, while the word lines WL0 to WL7 and the select gate line SGS are connected in common among the plurality of string units SU0 to SU3 in the same block BLK, the select gate lines SGD are independent for each of the string units SU0 to SU3 even in the same block BLK.

The word lines WL0 to WL7 are connected to the gates of the memory cells MT0 to MT7, respectively, that make up the NAND string NS. The gates of memory cells MTi in the same row in the block BLK are connected to the same word line WLi. In the following description, the NAND string NS may be simply referred to as a "string."

Each NAND string NS is connected to a corresponding bit line. Therefore, each memory cell MT is connected to a bit line via the select transistors ST in the NAND string NS or via the select transistors ST in the NAND string NS and one or more of the other memory cells MT in the NAND string NS. As described above, the data of the memory cells MT in the same block BLK are collectively erased. Meanwhile, reading and writing of data are performed in the unit of a memory cell group MG (or in the unit of a page). In the descriptions herein, the plurality of memory cells MT which are connected to one word line WLi and belong to one string unit SU are defined as the memory cell group MG. In the present embodiment, the nonvolatile memory 2 is a QLC (Quad-Level Cell) NAND memory, in which 4-bit (16-level) data is stored. Therefore, one memory cell group MG can store data corresponding to four pages. The four bits which can be stored by each memory cell MT correspond to the four pages, respectively.

Figure 4:
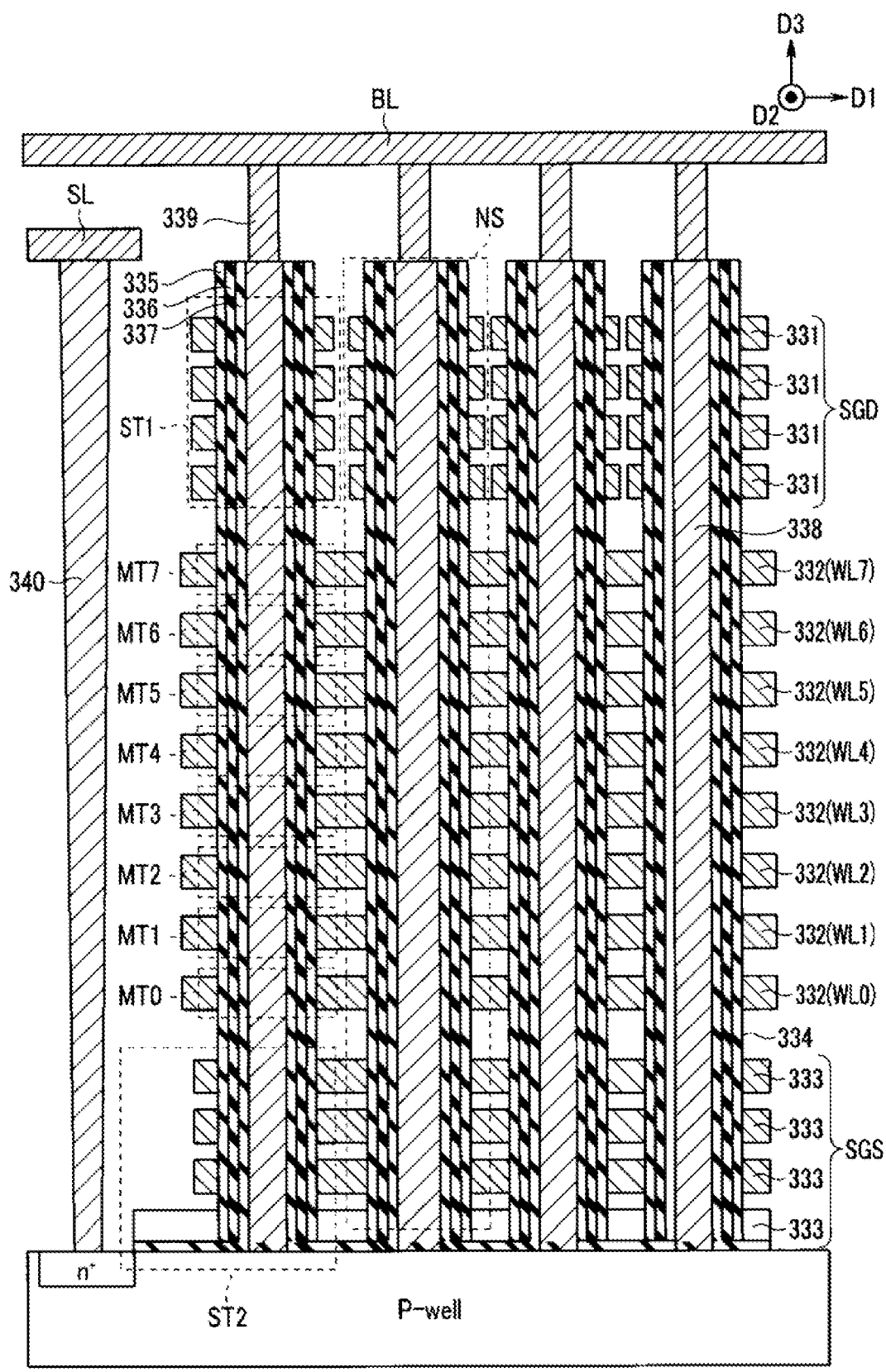
FIG. 4 is a sectional view of a partial region of the three-dimensional NAND memory cell array according to an embodiment.

FIG. 4 is a sectional view of a partial region of the three-dimensional NAND memory cell array. As illustrated in FIG. 4, a plurality of NAND strings NS are formed on a p type well region (P-well). That is, a plurality of wiring layers 333 that function as a select gate line SGS, a plurality of wiring layers 332 that function as a word line WLi, and a plurality of wiring layers 331 that function as a select gate line SGD are stacked on the p type well region.

Then, a memory hole 334 is formed to penetrate the wiring layers 333, 332, and 331 and reach the p type well region. A block insulating film 335, a charge storage film (charge storage region) 336, and a gate insulating film 337 are formed in this order on the side surface of the memory hole 334, and a semiconductor pillar 338 is embedded in the memory hole 334. The semiconductor pillar 338 is made of, for example, polysilicon, and functions as a region in which a channel is formed when the memory cells MT and the select transistors ST1 and ST2 in the NAND string NS are operated. That is, the wiring layer 331, the semiconductor pillar 338, and the films 335 to 337 between the wiring layer 331 and the semiconductor pillar 338 function as the select transistor ST1, the wiring layer 332, the semiconductor pillar 338, and the films 335 to 337 between the wiring layer 332 and the semiconductor pillar 338 function as the memory cell MT, and the wiring layer 333, the semiconductor pillar 338, and the films 335 to 337 between the wiring layer 333 and the semiconductor pillar 338 function as the select transistor ST2.

In each NAND string NS, the select transistor ST2, the plurality of memory cells MT, and the select transistor ST1 are formed in this order on the p type well region. A wiring layer that functions as a bit line BL is formed above the semiconductor pillar 338. A contact plug 339 is formed on the upper end of the semiconductor pillar 338 to connect the semiconductor pillar 338 and the bit line BL to each other.

Further, an n+ type impurity diffusion layer and a p+ type impurity diffusion layer are formed in the surface of the p type well region. A contact plug 340 is formed on the n+ type impurity diffusion layer, and a wiring layer that functions as a source line SL is formed on the contact plug 340.

A plurality of structures that are configured as illustrated in FIG. 4 and described above are arranged in the depth direction (i.e., into the paper surface of FIG. 4), and one string unit SU is formed by a set of plural NAND strings lined up in the depth direction.

(Threshold Voltage Distribution)

The operation of writing data into the memory cell MT generally includes a program operation and a verify operation. The program operation refers to an operation of raising a threshold voltage of the memory cell MT by injecting electrons into the charge storage film 336 (or maintaining a threshold voltage by inhibiting the injection). At the time of program operation, the controller 22 controls the word line driver 25 to apply a program voltage Vpgm to a word line WL connected to a target memory cell MT, and controls the sense amplifier circuit 24 to apply a bit line voltage corresponding to the data to be written to a bit line BL connected to the target memory cell MT.

Hereinafter, the operation of raising the threshold voltage is referred to as a "0" program or a "0" write, and the operation of maintaining the threshold voltage is referred to as a "1" program, a "1" write or a "write inhibition." A bit line voltage Vbl_L corresponding to "0" data is applied to a bit line BL targeted for the "0" program. A bit line voltage Vbl_H corresponding to "1" data is applied to a bit line BL targeted for the "1" program. For example, the bit line voltage Vbl_L is 0 V, and the bit line voltage Vbl_H is 2.5 V.

When multilevel data is written into the memory cell MT, the threshold voltage of the memory cell MT is set to a value according to the value of data. When the program voltage Vpgm and the bit line voltage Vbl_L are applied to the memory cell MT, electrons are injected into the charge storage film 336 so that the threshold voltage rises. By increasing the program voltage Vpgm, the injected amount of electrons can be increased, and the threshold voltage of the memory cell MT can be increased. However, even when the same program voltage Vpgm is applied, the injected amount of electrons differs for each memory cell MT due to the variation of the memory cell MT. Once the electrons are injected, the electrons are stored in the memory cell MT until an erase operation is performed on the memory cell MT. Therefore, the write operation is divided into multiple loops to gradually raise the program voltage Vpgm such that the program voltage Vpgm does not exceed a range of threshold voltage set for each memory cell MT (hereinafter, referred to as a target range).

Then, after the program operation, data is read to perform the verify operation that determines whether the threshold voltage of the memory cell has reached the target range. By repeating the combination of the program operation and the verify operation, the threshold voltage of the memory cell is increased to the target range. When it is determined by the verify operation that the threshold voltage of the memory cell has reached the target range, that is, exceeds a target level which is the lowest value of the target range, the memory cell is subjected to the write inhibition.

Figure 5:
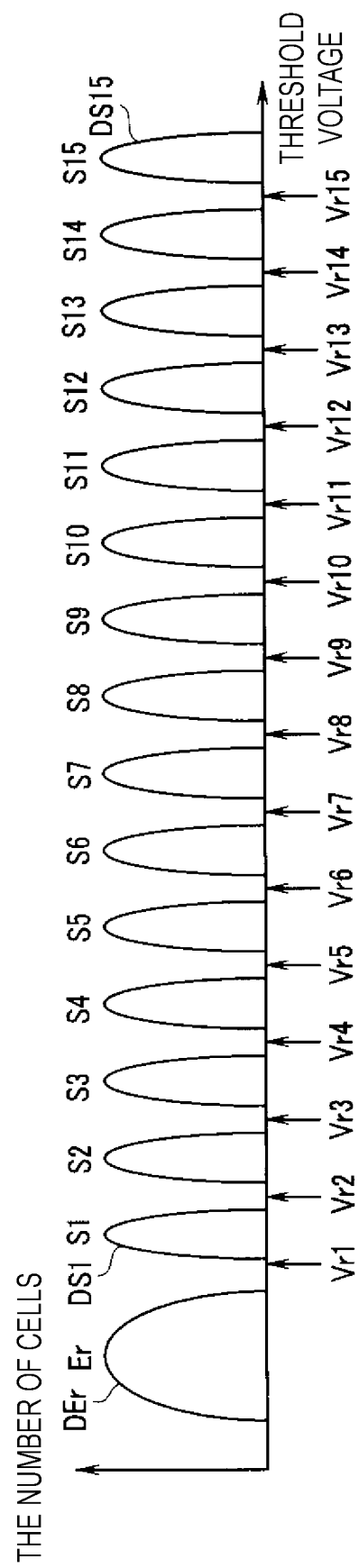
FIG. 5 is a view illustrating a threshold voltage distribution of a memory cell array.

FIG. 5 is a view illustrating the threshold voltage distribution of the memory cell array. FIG. 5 illustrates an example of the threshold voltage distribution of the 4 bit/cell nonvolatile memory 2. In the nonvolatile memory 2, the threshold voltage of the memory cell MT is set according to each data value of multi-level data stored in the memory cell MT. Since the injection of charges into the charge storage film is stochastic, as illustrated in FIG. 5, the threshold voltages of the memory cells MT are also statistically distributed.

FIG. 5 illustrates a threshold voltage distribution having 16 lobes (or distributions) DEr, DS1, DS2, DS3, . . . , DS13, DS14, and DS15, with the horizontal axis representing a threshold voltage and the vertical axis representing the number of memory cells. In the threshold voltage distribution, the width of a threshold voltage of each region corresponds to each target range. In the example of FIG. 5, it is possible to store 16-level data (4-bit data) in the memory cell MT by setting the threshold voltage of the memory cell MT to any of the 16 target ranges.

In the present embodiment, a target range in which the threshold voltage Vth is equal to or lower than a voltage Vr1 in FIG. 5 is referred to as a state Er, a target range in which the threshold voltage is higher than the voltage Vr1 and is equal to or lower than a voltage Vr2 is referred to as a state S1, a target range in which the threshold voltage is higher than the voltage Vr2 and is equal to or lower than a voltage Vr3 is referred to as a state S2, and a target range in which the threshold voltage is higher than the voltage Vr3 and is equal to or lower than a voltage Vr4 is referred to as a state S3. Likewise, as illustrated in FIG. 5, states S4 to S15 are set according to the respective voltages.

That is, a state indicates a target range which corresponds to a data value to be stored in each memory cell MT. In a case of 4-bit 16-level, the target range is divided into 16 states Er and S1 to S15. The threshold voltage distributions that correspond to the states Er, S1, S2, S3, . . . , S13, S14, and S15, respectively, are referred to as distributions DEr, DS1, DS2, DS3, . . . , DS13, DS14, and DS15, respectively. The voltages Vr1 to Vr15 are reference voltages which are boundaries between the respective target ranges. In the verify operation, the voltages Vr1 to Vr15 are applied to the word lines WL as verify voltages to perform a read, and it is determined that the target memory cell MT has reached a threshold voltage corresponding to the target state, when the target memory cell MT is turned off.

(Write Operation)

Figure 6:
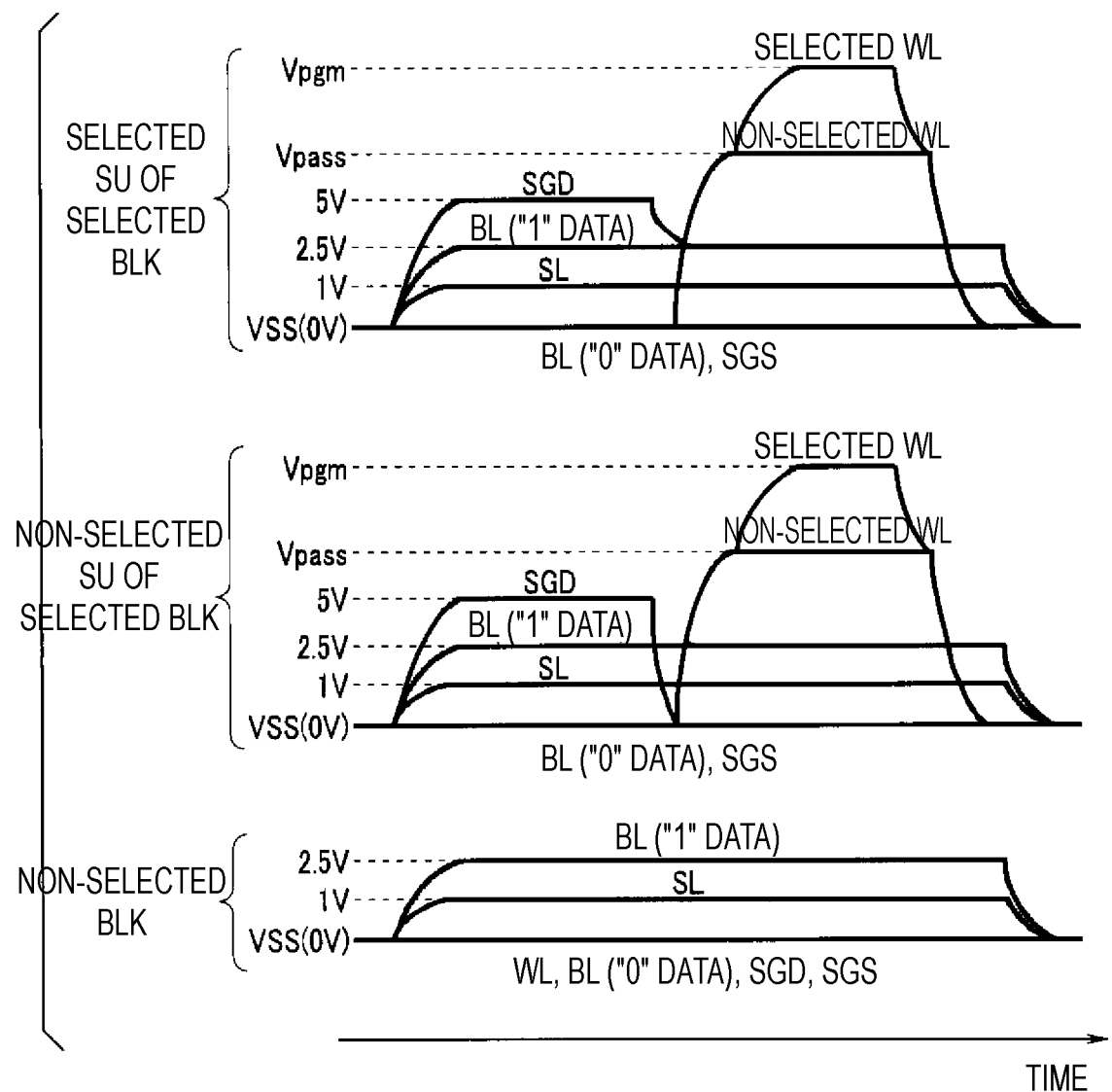
FIG. 6 is a view illustrating a voltage change of each wiring at the time of write operation.

FIG. 6 is a view illustrating a voltage change of each wiring at the time of write operation. FIG. 6 illustrates a voltage change of each wiring at the time of program operation. The program operation is performed according to a program voltage applied to a word line and a bit line voltage applied to a bit line. A block BLK in which no voltage is applied to word lines (selected WL and non-selected WL in FIG. 6) is a non-selected BLK (lower part in FIG. 6) which is not a write target. Further, since the bit line voltage is applied to the memory cell MT when the select transistor ST1 connected to the bit line BL becomes conductive, a string unit SU to which the select gate line SGD is not applied in the block BLK of a write target (selected BLK) is a non-selected SU which is not a write target (middle part in FIG. 6). For the non-selected SU (middle part in FIG. 6) of the selected BLK, the select gate line SGD may be set to, e.g., 5 V to make the select transistor ST1 conductive before the application of the program voltage Vpgm. For a write target string unit SU (selected SU) (upper part in FIG. 6) of the write target block BLK (selected BLK), as illustrated in the left side of the upper part in FIG. 6, the select gate line SGD is set to, e.g., 5 V to make the select transistor ST1 conductive before the application of the program voltage Vpgm. Further, at the time of write operation, the select gate line SGS is, for example, at 0 V. Therefore, the select transistor ST2 is turned off. Meanwhile, at the time of application of the program voltage Vpgm illustrated in the right side of the upper part in FIG. 6, the select gate line SGD is set to, e.g., 2.5 V. As a result, the turn-on/off state of the select transistor ST1 is determined by the bit line voltage of the bit line BL connected to the select transistor ST1.

As described above, the sense amplifier circuit 24 transfers data to each bit line BL. For example, a ground voltage Vss of 0 V is applied as the bit line voltage Vbl_L to the bit line BL to which "0" data is applied. A write inhibition voltage Vinhibit (e.g., 2.5 V) is applied as the bit line voltage Vbl_H to the bit line BL to which "1" data is applied. Therefore, at the time of application of the program voltage Vpgm, a select transistor ST1 connected to a bit line BL to which "0" data is applied becomes conductive, and a select transistor ST1 connected to a bit line BL to which "1" data is applied is cut off. For a memory cell MT connected to the cut-off select transistor ST1, write is inhibited.

In the memory cell MT connected to the select transistor ST1 that has become the conductive state, electrons are injected into the charge storage film according to a voltage applied to the word line WL. A memory cell MT connected to a word line WL to which a voltage Vpass is applied as a word line voltage becomes the conductive state, regardless of the threshold voltage, but electrons are not injected into the charge storage film. Meanwhile, in a memory cell MT connected to a word line WL to which the program voltage Vpgm is applied as a word line voltage, electrons are injected into the charge storage film according to the program voltage Vpgm.

That is, the word line driver 25 selects any one word line WL in the selected block BLK, applies the voltage Vpgm to the selected word line, and applies the voltage Vpass to the other non-selected word lines WL. The voltage Vpgm is a high voltage for injecting electrons into the charge storage film by the tunnel phenomenon, and is higher than Vpass. By supplying data to each bit line BL using the sense amplifier circuit 24 while controlling the voltage of the word line WL using the word line driver 25, the operation of writing data into each memory cell MT of the memory cell array 23 is performed.

Figure 7:
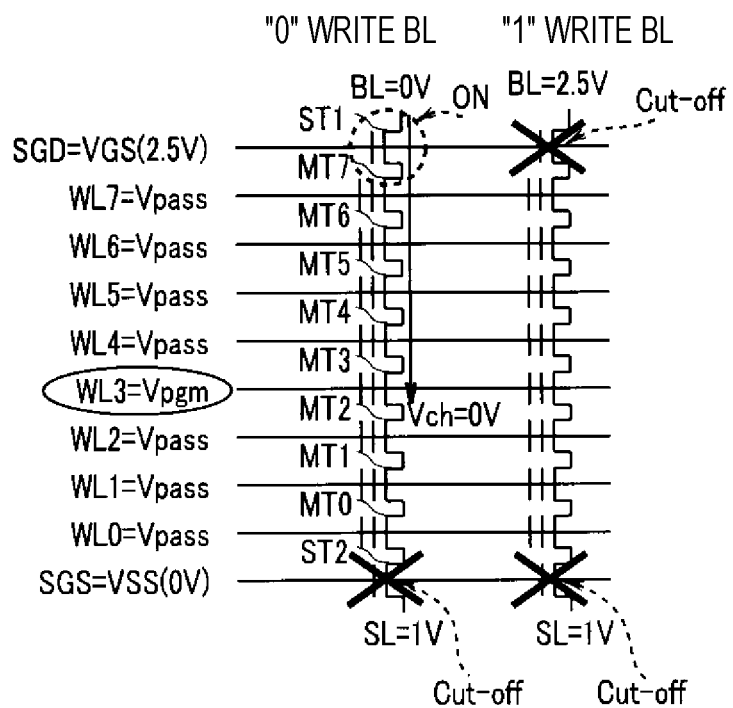
FIG. 7 is a circuit diagram illustrating the state of a string at the time of write operation.

FIG. 7 is a circuit diagram illustrating the state of a string during a write operation.

FIG. 7 illustrates two NAND strings that correspond to a bit line BL to be written with "0" and a bit line BL to be written with "1," respectively. FIG. 7 further illustrates a state when a word line WL3 is selected.

As illustrated, the voltage Vpgm is applied to the selected word line WL3, and the voltage Vpass is applied to the non-selected word lines WL0 to WL2 and WL4 to WL7.

Then, in the NAND string that corresponds to the bit line BL to be written with "0," the select transistor ST1 is turned on. Therefore, the channel voltage Vch of the memory cell MT3 connected to the selected word line WL3 becomes 0 V. That is, a voltage difference between the gate and the channel is increased. As a result, electrons are injected into the charge storage film so that the threshold voltage of the memory cell MT3 is raised.

In the NAND string that corresponds to the bit line BL to be written with "1," the select transistor ST1 is cut off. Therefore, the channel of the memory cell MT3 connected to the selected word line WL3 becomes electrically floating so that the channel voltage Vch is raised to be close to the voltage Vpgm by capacitive coupling with the word line WL or the like. That is, the voltage difference between the gate and the channel is decreased. As a result, electrons are not injected into the charge storage film, and the threshold voltage of the memory cell MT3 is maintained (the threshold voltage does not change to the extent that the threshold voltage distribution level transitions to a higher distribution).

(Standard Write Sequence)

Figure 8:
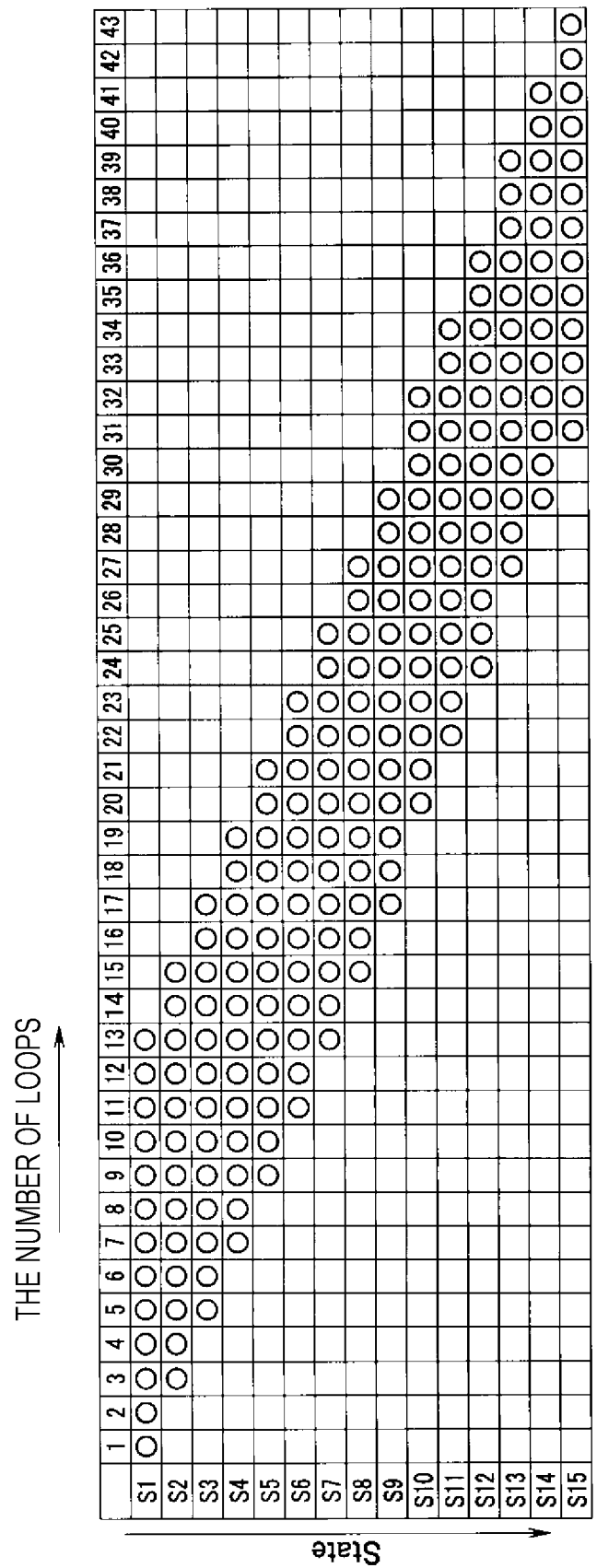
FIG. 8 illustrates a standard write sequence.

FIG. 8 illustrates a standard write sequence. FIG. 8 illustrates an example in which data is written by repeating the combination of the program operation and the verify operation 43 times. This repetitive operation is referred to as a "loop." The program voltage Vpgm is set to the lowest voltage value in the first loop, and set to a voltage value that increases with the second loop, third loop, etc. Circles in FIG. 8 indicate loops capable of performing the verify operation. In each of the states S1 to S15, the program operation is performed from the first to last loops indicated with circles.

For example, for a memory cell MT set in the state S2, there is a possibility that the program operation is performed from the first loop up to the fifteenth loop while gradually increasing the program voltage Vpgm. The verify operation is performed only in the circled loops, and when it is determined by the verify operation that a threshold voltage of a memory cell MT reaches a set target range, the memory cell is subjected to the write inhibition.

(QPW)

Figure 9:
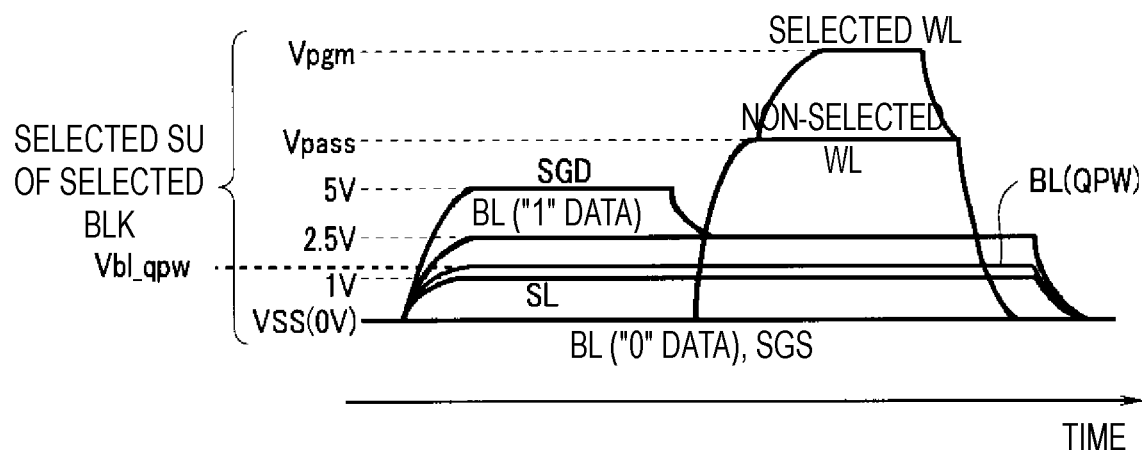
FIG. 9 is a view illustrating a voltage change of each wire at the time of QPW operation.

FIG. 9 is a view illustrating a voltage change of each wiring at the time of QPW operation. During the write operation, in addition to the above-described (normal) program operation, the QPW operation may be performed as a program operation.

In the example of FIG. 7, the bit line voltage Vbl_L (e.g., the ground voltage Vss, e.g., 0 V) is applied to a bit line BL (assigned with "0" data) corresponding to a memory cell (memory cell transistor) MT of which the threshold voltage is desired to be raised, and the bit line voltage Vbl_H (e.g., 2.5 V) is applied to a bit line BL (assigned with "1" data) corresponding to a memory cell (memory cell transistor) MT of which the threshold voltage is not desired to be raised. In this case, only the two controls of raising and maintaining the threshold voltage can be performed on the plurality of memory cells MT in the memory cell group MG.

Therefore, in the QPW operation, as illustrated in FIG. 9, for example, a voltage higher than the bit line voltage Vbl_L (the ground voltage Vss, e.g., 0 V) and lower than the bit line voltage Vbl_H (the write inhibition voltage Vinhibit, e.g., 2.5 V) is applied to a bit line BL corresponding to a memory cell MT of which the threshold voltage is desired to be raised by a small amount. That is, the charging level of the bit line BL is raised more than that of the bit line BL (assigned with "0" data) corresponding to the memory cell MT of which the threshold voltage is desired to be raised. Thus, in the target memory cell MT, the channel voltage Vch rises higher than the voltage Vbl_L (the ground voltage Vss, e.g., 0 V). Therefore, an effective program voltage applied to the memory cell MT is lowered by the amount of increase of channel voltage Vch, and injection of electrons into the charge storage film by the voltage Vpgm applied to the selected word line WL is relaxed. Therefore, when the normal program operation and the QPW operation are combined, the following three controls can be performed on the memory cell MT: raising the threshold voltage; maintaining the threshold voltage; and raising the threshold voltage by a small amount. Hereinafter, the voltage applied to a bit line BL for the QPW operation is referred to as a QPW voltage Vbl_qpw.

Figure 10:
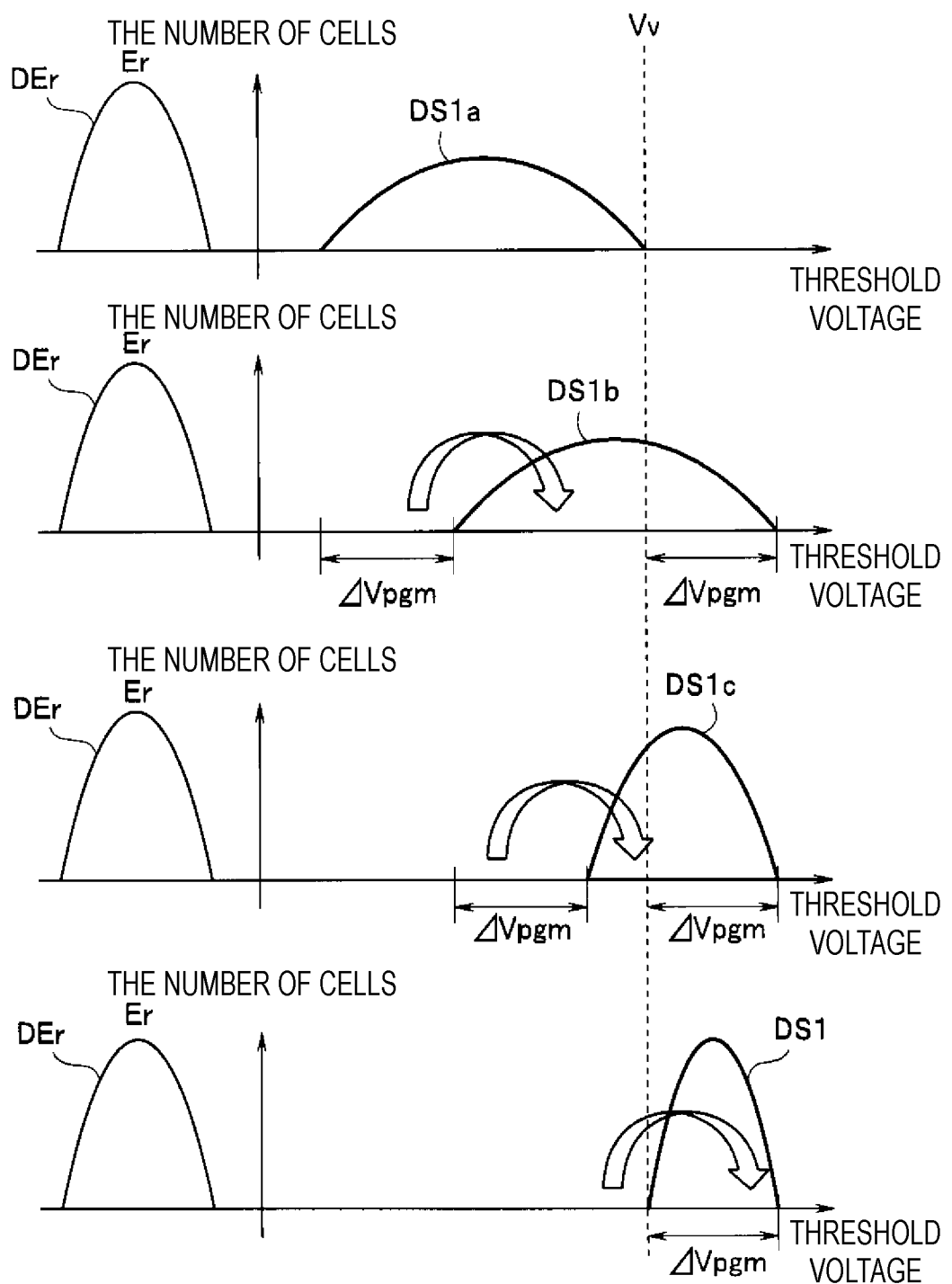
FIG. 10 illustrates a change in threshold voltage by the normal program operation with the horizontal axis representing a threshold voltage and the vertical axis representing the number of cells.
Figure 11:
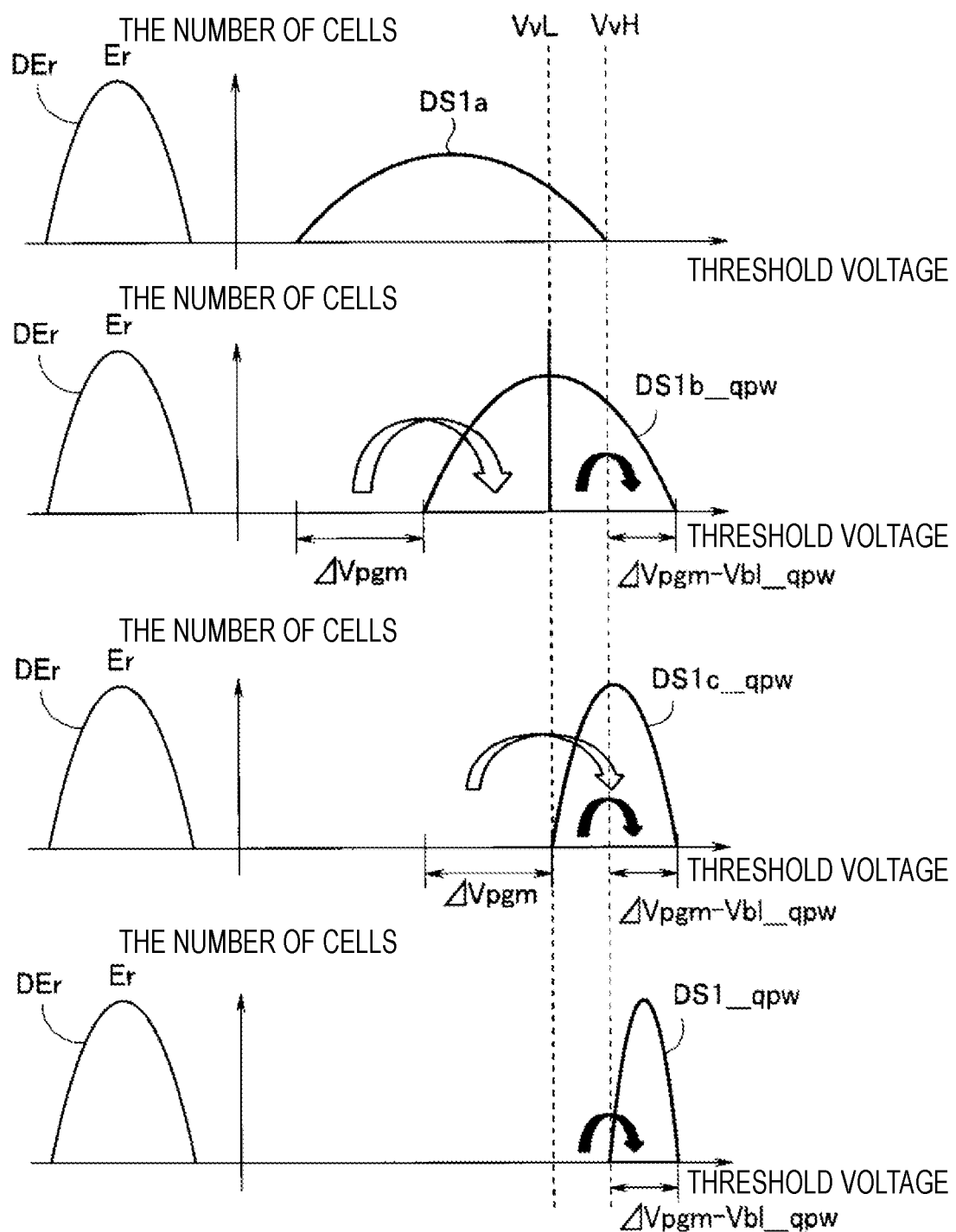
FIG. 11 illustrates a change in threshold voltage by the QPW operation with the horizontal axis representing a threshold voltage and the vertical axis representing the number of cells.

FIGS. 10 and 11 illustrate a change in threshold voltage by the normal program operation and the QPW operation, with the horizontal axis representing the threshold voltage and the vertical axis representing the number of cells. FIG. 10 illustrates the normal program operation, and FIG. 11 illustrates the QPW operation.

In FIGS. 10 and 11, the distribution DEr represents a threshold voltage distribution of the state Er, and the distribution DS1$a$ represents an example of a threshold voltage distribution obtained by a write into each memory cell MT of the target state S1, for example, in the first loop. The example of FIG. 10 represents that the verify operation using a verify voltage Vv is performed on each memory cell MT of the target state S1. In the normal program operation, the bit line voltage is fixed at, e.g., 0 V, and the program voltage is equal to the effective program voltage.

Since the distribution DS1$a$ does not reach the verify voltage Vv, the program voltage is increased by $\Delta$Vpgm for each memory cell MT to perform the second loop.

As a result of the increase in program voltage by $\Delta$Vpgm, the threshold voltage of each memory cell MT rises by an amount corresponding to $\Delta$Vpgm (indicated by an arrow), so that a distribution DS1$b$ is obtained. For a memory cell MT in the distribution DS1$b$ having a threshold voltage higher than the verify voltage Vv, write is inhibited, and for a memory cell MT in the distribution DS1$b$ that does not reach the verify voltage Vv, write is performed in the following third loop by also increasing the program voltage by $\Delta$Vpgm.

As a result, in the memory cell MT in the distribution DS1$b$ that does not reach the verify voltage Vv, the threshold voltage rises (as indicated by an arrow) by an amount corresponding to $\Delta$Vpgm, so that a distribution DS1$c$ is obtained. For a memory cell MT in the distribution DS1$c$ having a threshold voltage higher than the verify voltage Vv, write is inhibited, and for a memory cell MT in the distribution DS1$c$ that does not reach the verify voltage Vv, write is performed in the following fourth loop by also increasing the program voltage increased by $\Delta$Vpgm. As a result, in the memory cell MT in the distribution DS1$c$ that does not reach the verify voltage Vv, the threshold voltage rises (as indicated by an arrow) by an amount corresponding to $\Delta$Vpgm, so that a distribution DS1 is obtained. The distribution DS1 indicates that all the memory cells MT have a threshold voltage higher than the verify voltage Vv, and all the memory cells MT set in the target state S1 are subjected to the write inhibition.

In the QPW operation, as illustrated in FIG. 11, the verify operation is performed using a verify voltage VvH corresponding to the verify voltage Vv, and a verify voltage VvL lower than the verify voltage VvH, as verify voltages. Hereinafter, the verify voltage VvH may be referred to as a verify high level, and the verify voltage VvL may be referred to as a verify low level. According to the verify operation, it is determined whether the threshold voltage of a target memory cell MT is lower than the verify low level, falls between the verify low level and the verify high level, or is higher than the verify high level.

Then, when the threshold voltage of the memory cell MT is lower than the verify low level, the program voltage is increased by $\Delta$Vpgm as usual. When the threshold voltage is higher than the verify high level, write is inhibited. When the threshold voltage falls between the verify low level and the verify high level, the amount of increase of the effective program voltage is set to be smaller than $\Delta$Vpgm.

In the QPW, in order to set the amount of increase of the effective program voltage to be smaller than $\Delta$Vpgm, the program voltage Vpgm is increased by $\Delta$Vpgm, and simultaneously, the bit line voltage is increased from Vbl_L to the QPW voltage Vbl_qpw (Vbl_L<Vbl_qpw). Therefore, the amount of increase of the effective program voltage becomes ($\Delta$Vpgm−Vbl_qpw).

In the example of FIG. 11, the verify operation using the verify low level and the verify high level is performed on each memory cell MT of the target state S1. Assuming that the verify operation is performed in the n-th (n is a natural number) loop in the write sequence, for a memory cell MT that does not reach the verify low level in the distribution DS1$a$, the effective program voltage is increased by $\Delta$Vpgm to perform the (n+1)-th loop. As a result, the threshold voltage of the target memory cell MT is increased by an amount corresponding to $\Delta$Vpgm (see arrows in white).

Meanwhile, for a memory cell MT of which the threshold voltage falls between the verify low level and the verify high level in the distribution DS1$a$, the effective program voltage is increased by $\Delta$Vpgm and the bit line voltage is increased to the QPW voltage Vbl to perform the (n+1)-th loop. As a result, the effective program voltage of the target memory cell MT is increased by ($\Delta$Vpgm−Vbl_qpw), and the threshold voltage thereof is increased by an amount corresponding to the amount of increase of the effective program voltage (see arrows in black). As a result, it is expected that the threshold voltage of the target memory cell MT is to exceed the verify high level by the (n+1)-th loop. Thus, a threshold voltage distribution DS1$b$ qpw is obtained by the (n+1)-th loop.

For a memory cell MT in the distribution DS1$b$_qpw having a threshold voltage higher than the verify high level, write is inhibited, and for a memory cell MT in the distribution DS1$b$_qpw that does not reach the verify low level, write is performed in the next (n+2)-th loop by also increasing the effective program voltage by $\Delta$Vpgm. Further, for a memory cell MT of which the threshold voltage falls between the verify low level and the verify high level in the distribution DS1$b$_qpw (the bit line voltage Vbl_L is applied to the connected bit line BL), the program voltage is increased by $\Delta$Vpgm and the bit line voltage is increased to the QPW voltage Vbl_qpw, to perform the (n+2)-th loop. As a result, the effective program voltage of the target memory cell MT is increased by (ΔVpgm−Vbl_qpw), and the threshold voltage thereof is increased by an amount corresponding to the amount of increase of the effective program voltage (see arrows in black). As a result, it is expected that the target memory cell MT is to exceed the verify high level by the (n+2)-th loop. Thus, a threshold voltage distribution DS1c_qpw is obtained by the (n+2)-th loop.

For a memory cell MT in the distribution DS1c_qpw having a threshold voltage higher than the verify high level, write is inhibited. For a memory cell MT of which the threshold voltage falls between the verify low level and the verify high level in the distribution DS1c_qpw, in the next (n+3)-th loop, the program voltage is increased by ΔVpgm and the bit line voltage is increased to the QPW voltage Vbl_qpw, to perform the (n+3)-th loop. As a result, the effective program voltage of the target memory cell MT is increased by (ΔVpgm−Vbl_qpw), and the threshold voltage thereof is increased by an amount corresponding to the amount of increase of the effective program voltage (see arrows in black). As a result, it is expected that the target memory cell MT is to exceed the verify high level by the (n+3)-th loop. Thus, a threshold voltage distribution DS1_qpw is obtained by the (n+3)-th loop.

As illustrated in FIG. 10, in the normal program operation, each memory cell MT in the target state S1 has a distribution represented in the threshold voltage distribution DS1, and the width of the target range is ΔVpgm. Meanwhile, in the QPW operation, as illustrated in FIG. 11, each memory cell MT in the target state S1 has a distribution represented in the threshold voltage distribution DS1_qpw, and the width of the target range is ΔVpgm−Vbl_qpw, to narrow the width of the threshold voltage distribution.

As illustrated in FIG. 11, the width of the threshold voltage distribution during the QPW operation corresponds to the magnitude of change of the threshold voltage, that is, the amount of increase of the effective program voltage. Therefore, by increasing the bit line voltage to reduce the amount of increase of the effective program voltage, the magnitude of change of threshold voltage can be reduced, and the width of the threshold voltage distribution can be further reduced.

(Pass Write Effect)

In the QPW operation, normally, ΔVpgm is greater than Vbl_qpw, and the amount of increase of the effective program voltage (ΔVpgm−Vbl_qpw) has a positive value. It is expected that with one increase of this effective program voltage, the threshold voltage is to become a value in the target range of the target state. To the contrary, when the bit line voltage is increased such that the amount of increase of the effective program voltage becomes a negative value, electrons are not injected into the charge storage film. Further, even when the amount of increase of the effective program voltage is returned to the positive value in the next loop, the threshold voltage does not necessarily rise according to the amount of increase but gently rises. This phenomenon is called a pass write effect. This pass write effect can be used to reduce a change in threshold voltage and to further narrow the width of a threshold voltage distribution.

Figure 12:
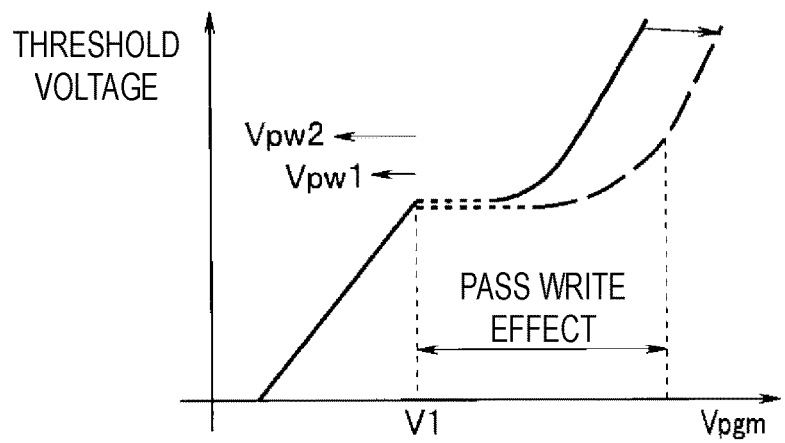
FIG. 12 illustrates a change in threshold voltage due to a pass write effect.
Figure 13:
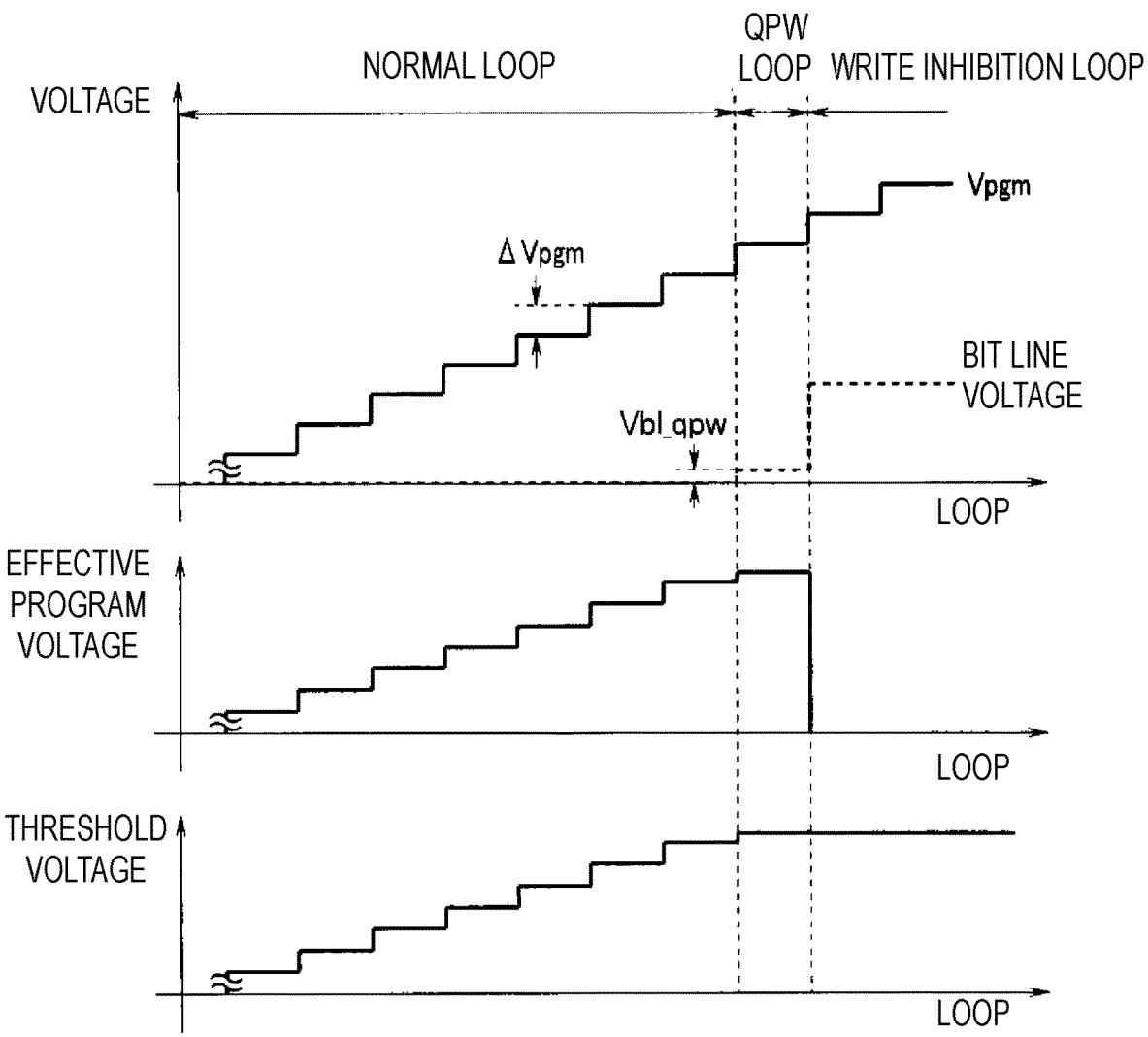
FIG. 13 illustrates a change in threshold voltage due to the QPW operation.
Figure 14:
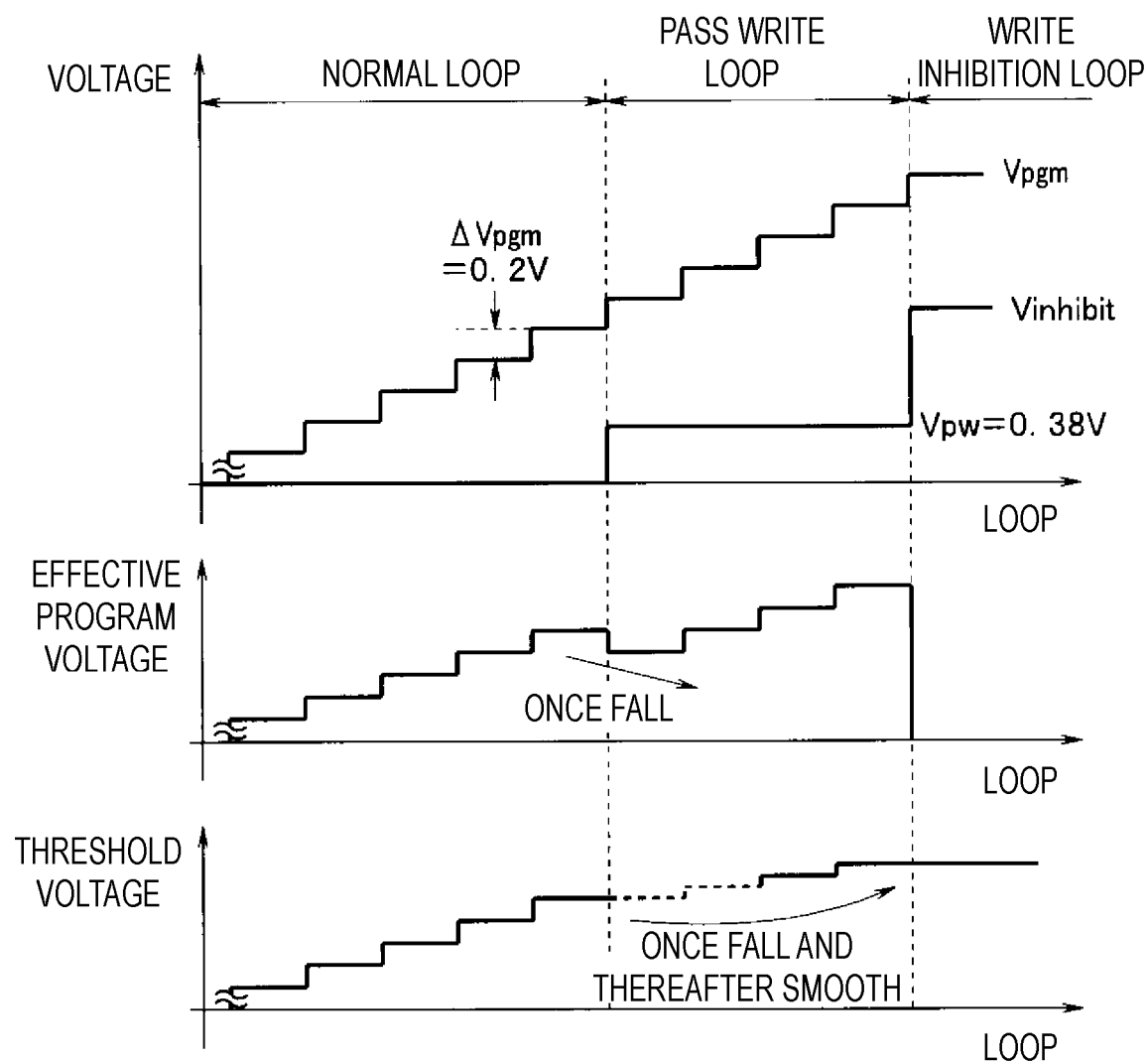
FIG. 14 illustrates a change in threshold voltage due to the pass write operation.

FIG. 12 illustrates the state of a change in threshold voltage according to a voltage applied to a bit line, with the horizontal axis representing the program voltage Vpgm which increases for each loop and the vertical axis representing the threshold voltage. FIGS. 13 and 14 illustrate the relationship among the program voltage Vpgm, the bit line voltage, the effective program voltage, and the threshold voltage. FIG. 13 illustrates an example of a quick pass write (QPW) operation, and FIG. 14 illustrates an example of a pass write operation using the pass write effect. Since FIGS. 13 and 14 are intended to explain the schematic relationship, FIGS. 13 and 14 do not provide accurate measurements and may have different voltage scales.

As illustrated in FIG. 12, the program voltage Vpgm gradually rises for each loop from the first loop. Now, it is assumed that the bit line voltage is 0 V. The threshold voltage rises along with the rise of the program voltage Vpgm. In a loop in which the program voltage reaches a voltage V1, a bit line voltage Vpw1 higher than the amount of increase of the program voltage Vpgm is applied to the bit line BL. Then, the effective program voltage decreases, and the threshold voltage does not increase as indicated by a dashed line in FIG. 12. As the loop progresses, the program voltage Vpgm increases. When the effective program voltage increases to be higher than an effective program voltage at the time of the loop in which the program voltage reaches the voltage V1, the threshold voltage starts to rise as indicated by a solid line waveform.

Further, in the loop in which the program voltage reaches the voltage V1, a bit line voltage Vpw2 higher than the bit line voltage Vpw1 is applied to the bit line BL. Then, the effective program voltage decreases and the threshold voltage does not rise for a longer period than the period when the bit line voltage Vpw1 is applied. Further, even when the program voltage Vpgm increases as the loop progresses, the increase of the threshold voltage is moderated by the number of loops for a while as compared to the increase of the effective program voltage, as indicated by the characteristic of the dashed line in FIG. 12. That is, as identified from the pass write effect period of FIG. 12, a period of a predetermined number of loops after the application of the bit line voltage Vpw2 indicates that a change in threshold voltage is small due to the pass write effect. By controlling the write operation so as to reach the threshold voltage of the target state in the pass write effect period, it is possible to narrow the width of a threshold voltage distribution.

In the present embodiment as well, a threshold voltage determination level as to whether or not the threshold voltage reaches the target range of the target state is referred to as a verify high level, and a level lower than the verify high level is referred to as a verify low level. In addition, when it is determined as the result of the verify operation that a threshold voltage of a memory cell does not reach the verify low level, the memory cell is referred to as a write-deficient cell. When it is determined that a threshold voltage of a memory cell exceeds the verify high level, the memory cell is referred to as a write-complete cell. When it is determined that a threshold voltage of a memory cell falls between the verify low level and the verify high level, the memory cell is referred to as a pass write cell.

Further, a program operation performed until it is determined by the verify operation that a threshold voltage of a write target memory cell MT reaches the verify low level is referred to as a normal program operation, and a loop in which the normal program operation is performed is referred to as a normal loop. A program operation performed after it is determined by the verify operation that the threshold voltage falls between the verify low level and the verify high level is referred to as a pass write program operation, and a loop in which the pass write program operation is performed is referred to as a pass write loop. A loop performed after the threshold voltage exceeds the verify high level is referred to as a write inhibition loop. Further, in the present embodiment, since the pass write effect is used, a voltage applied to the bit line BL in the pass write program operation is referred to as a pass write voltage.

FIGS. 13 and 14 illustrate a write using the QPW and a write using the pass write effect. As illustrated in FIGS. 13 and 14, the program voltage Vpgm applied to the word line WL sequentially increases by Vpgm for each loop. During the QPW operation, when it is determined in the verify operation in the last normal loop (the last one among the normal loops) that the threshold voltage falls between the verify low level and the verify high level, a QPW voltage is applied to the bit line in a next loop. This loop is referred to as a quick pass write (QPW) loop.

The effective program voltage in the QPW loop is (the program voltage Vpgm−the QPW voltage), and the amount of increase of the effective program voltage due to the transition from the last normal loop to the QPW loop is (ΔVpgm−Vbl_qpw). In the QPW loop, an excessive increase in threshold voltage is prevented.

During the QPW operation, it is expected that the threshold voltage is to reach the target range of the target state by one (one loop) program operation of the QPW loop. In the example of FIG. 13, in the next loop of the QPW loop, the bit line voltage is set to the write inhibition voltage Vinhibit that cuts off the select transistor ST1. The next and subsequent loops are write inhibition loops.

Meanwhile, in the present embodiment, as illustrated in FIG. 14, when it is determined in the verify operation in the last normal loop that the threshold voltage falls between the verify low level and the verify high level, the pass write loop is subsequently executed. That is, the sense amplifier circuit 24 is controlled by the controller 22, and the pass write voltage Vpw is applied to the bit line. The pass write voltage Vpw is a voltage value larger than the amount of increase ΔVpgm of the program voltage Vpgm. Therefore, the effective program voltage due to the transition from the last normal loop to the pass write loop is reduced by (Vpw−ΔVpgm). Although FIG. 14 illustrates ΔVpgm=0.2V and Vpw=0.38V as an example, the values of ΔVpgm and Vpw may be appropriately set.

Theoretically, the threshold voltage does not increase in the first loop after the transition to the pass write loop since the effective program voltage has been reduced as compared with the last normal loop. In addition, as the program voltage Vpgm increases for each loop, the threshold voltage starts increasing in the next loop of the first loop after the transition to the pass write loop since the effective program voltage rises to be higher than the effective program voltage in the last normal loop. However, the threshold voltage in the pass write effect period rises gently as compared to the rise of the effective program voltage. While the rise of the threshold voltage during the pass write effect period particularly in the initial period is irregular, an example of a change of the threshold voltage during this period is indicated by dashed lines in FIG. 14.

In the example of FIG. 14, when the program operation by a four-loop period pass write loop is performed, the threshold voltage reaches the target range of the target state. As a result, the bit line voltage is set to the write inhibition voltage Vinhibit, and the subsequent loops are set as write inhibition loops. In this manner, the pass write effect can be used to make the change of the threshold voltage sufficiently small, and narrow the distribution of the threshold voltage that reaches the target range of the target state.

However, in the write using the pass write effect, the number of loops in the pass write loop increases, and the number of loops required for the write operation increases. As a result, the total time required for the write operation becomes longer.

Therefore, in the present embodiment, a voltage required to use the pass write effect is set as a voltage applied to the bit line BL, and the voltage applied to the bit line BL is changed to control the amount of the pass write effect. This can narrow the width of the threshold voltage distribution while preventing an increase in the number of loops required for the write operation.

(Control of Amount of Pass Write Effect)

Figure 15:
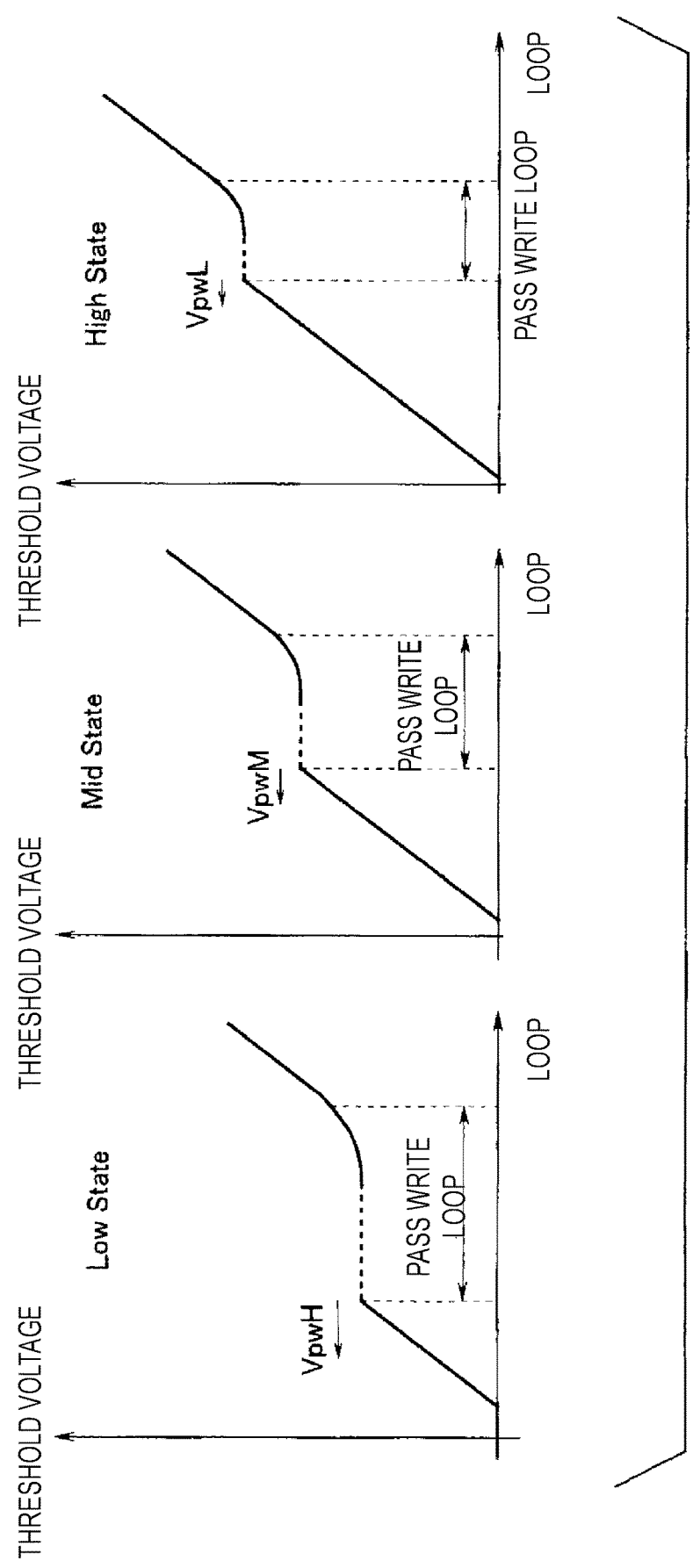
FIG. 15 illustrates the relationship between a control of an amount of the pass write effect and the number of loops in the present embodiment.

FIG. 15 illustrates the relationship between a control of the amount of the pass write effect and the number of loops in the present embodiment. Similarly to FIG. 12, FIG. 15 illustrates the state of a change of a threshold voltage according to the pass write voltage applied to the bit line BL, with the horizontal axis representing a loop and the vertical axis representing the threshold voltage.

The left side of FIG. 15 represents a program operation for a memory cell MT that belongs to a group in which the threshold voltage of the target state is relatively low (Low State). The central side of FIG. 15 represents a program operation for a memory cell MT that belongs to a group in which the threshold voltage of the target state is middle (Mid State). The right side of FIG. 15 represents a program operation for a memory cell MT that belongs to a group in which the threshold voltage of the target state is relatively high (High State).

In the example of FIG. 15, for the memory cell MT that belongs to the Low State group, a relatively high pass write voltage VpwH is applied to the bit line BL in the pass write loop. As a result, while the change in threshold voltage is reduced so that the width of the threshold voltage distribution can be extremely narrowed, the number of pass write loops is relatively large. Further, for the memory cell MT that belongs to the Mid State group, a middle pass write voltage VpwM is applied to the bit line BL in the pass write loop. As a result, the change in threshold voltage becomes substantially moderate so that the width of the threshold voltage distribution can be narrowed somewhat. The pass write loop is a medium number of times.

Meanwhile, for the memory cell MT that belongs to the High State group, a relatively low pass write voltage VpwL is applied to the bit line BL in the pass write loop. The pass write voltage VpwL may be set to a value smaller than the amount of increase ΔVpgm of the program voltage Vpgm. As a result, although the change in threshold voltage is somewhat increased, the width of the threshold voltage distribution can be narrower than that in the normal program operation. The number of pass write loops is relatively small. When the pass write voltage VpwL is set to a value smaller than ΔVpgm, it can be expected that the threshold voltage is to reach the target range of the target state by one pass write loop.

Although FIG. 15 illustrates an example of changing the pass write voltage according to the state to which the memory cell MT belongs, the determination criterion for changing the pass write voltage is not limited to the state to which the memory cell MT belongs (i.e., Low state, Mid state, High state). For example, the pass write voltage may be changed according to a loop to be performed in the write sequence, to change the amount of the pass write effect. Further, although an example in which the pass write voltage is changed in three ways has been described, it is possible to change the pass write voltage in any ways depending on how to set the determination criterion. In the present embodiment, by executing the pass write loop with the pass write voltage having a voltage value larger than ΔVpgm at least once (one loop), it is possible to obtain the pass write effect that at least one memory cell MT has a threshold voltage in a relatively narrow threshold voltage distribution.

In this manner, in the present embodiment, by changing the amount of the pass write effect, it is possible to change the number of loops required for the write operation. In order to control the amount of the pass write effect, the controller 22 controls the sense amplifier circuit 24 according to, for example, the state or the loop, to change the pass write voltage applied to the bit line BL.

(Sense Amplifier Circuit)

Next, descriptions will be made on the sense amplifier circuit 24 which supplies a bit line voltage including a pass write voltage to each bit line BL and performs a read of data stored in a memory cell MT and the verify operation.

Figure 16:
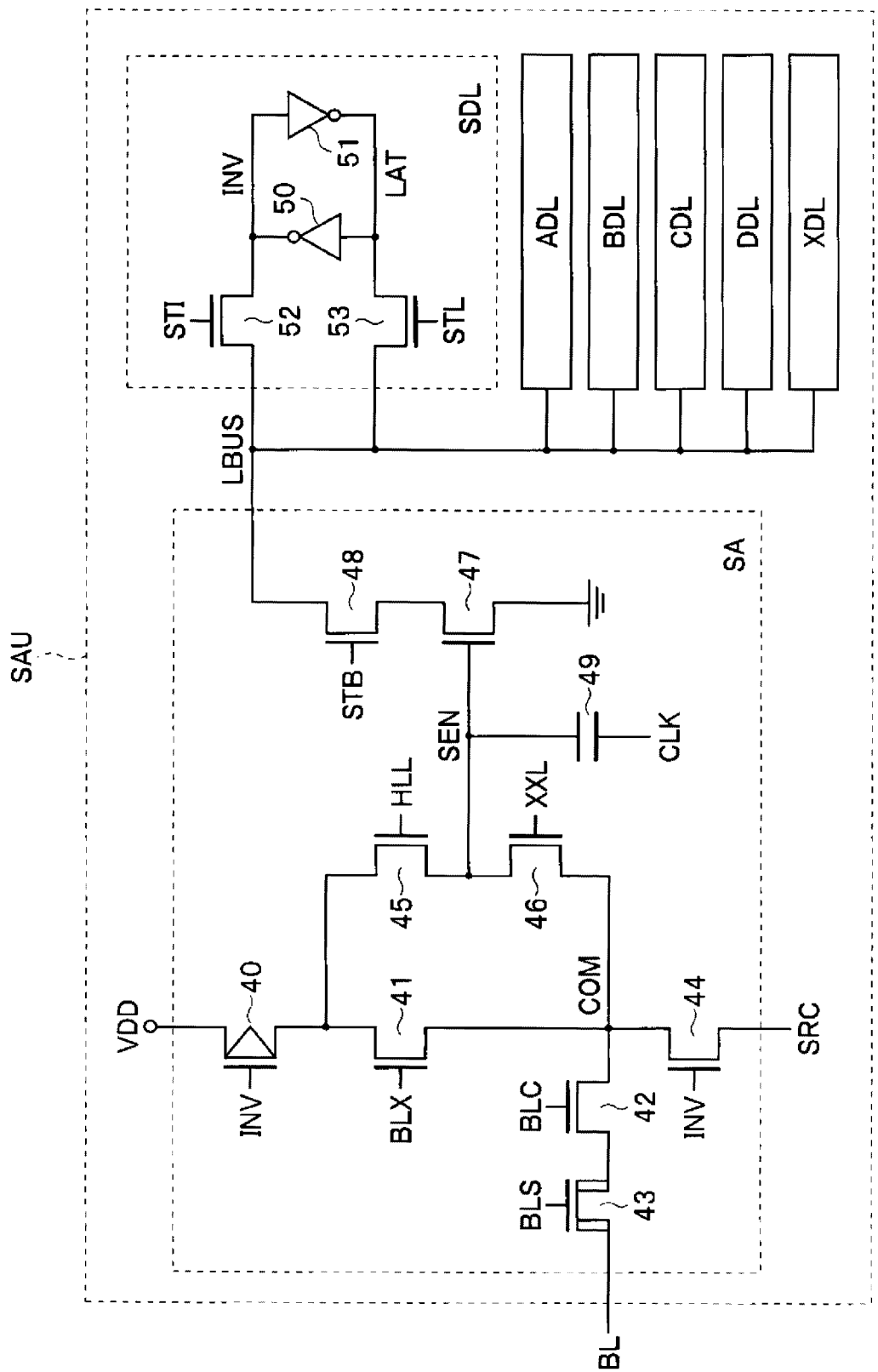
FIG. 16 is a circuit diagram illustrating an example of a specific configuration of a sense amplifier circuit in FIG. 1.

FIG. 16 is a circuit diagram illustrating an example of a specific configuration of the sense amplifier circuit 24 in FIG. 1.

The sense amplifier circuit 24 includes a plurality of sense amplifier units SAU associated with bit lines BL0 to BL(m−1), respectively. FIG. 16 illustrates a detailed circuit configuration of one sense amplifier unit SAU.

As illustrated in FIG. 16, the sense amplifier unit SAU includes a sense amplifier SA and latch circuits SDL, ADL, BDL, CDL, DDL, and XDL. The sense amplifier SA and the latch circuits SDL, ADL, BDL, CDL, DDL, and XDL are interconnected by a bus LBUS so as to be able to receive data. The latch circuits SDL, ADL, BDL, CDL, DDL, and XDL temporarily store read and write data. The latch circuit XDL is connected to the controller 22 to be used for data input/output between the sense amplifier unit SAU and the controller 22.

The latch circuit SDL includes, for example, inverters 50 and 51 and n-channel MOS transistors 52 and 53. The input node of the inverter 50 and the output node of the inverter 51 are connected to a node LAT. The input node of the inverter 51 and the output node of the inverter 50 are connected to a node INV. Data of the nodes INV and LAT are stored by the inverters 50 and 51. The write data from the controller 22 is supplied to the node LAT. The data stored in the node INV is the inversion of the data stored in the node LAT.

One end of the drain-source path of the transistor 52 is connected to the node INV, and the other end thereof is connected to the bus LBUS. Further, one end of the drain-source path of the transistor 53 is connected to the node INV, and the other end thereof is connected to the bus LBUS. A control signal STL is input to the gate of the transistor 53, and a control signal STI is input to the gate of the transistor 52.

Since the latch circuits ADL, BDL, CDL, DDL, and XDL have the same configuration as the latch circuit SDL, descriptions thereof will be omitted. Various control signals supplied to the sense amplifier unit SAU are provided from the controller 22.

The sense amplifier SA includes, for example, a p-channel MOS transistor 40, n-channel MOS transistors 41 to 48, and a capacitor 49.

In the read operation, the sense amplifier SA senses the data read into the corresponding bit line BL and determines whether the read data is "0" or "1." In addition, in the program operation, the sense amplifier SA sets the corresponding bit line BL to a voltage value corresponding to the data "0" and "1" to be written.

In the sense amplifier SA, the transistors 40 to 44 are involved in the program operation. The source-drain path of the transistor 40 and the drain-source path of the transistor 41 are connected in series between a power supply line that supplies an internal power supply voltage VDD and a node COM. Further, the drain-source path of the transistor 44 is connected between the node COM and a node SRC that supplies a ground voltage VSS. The drain-source path of the transistor 42 and the drain-source path of the transistor 43 are connected in series between the node COM and the bit line BL.

The gates of the transistors 40 and 44 are connected to the node INV. Therefore, when the node LAT is at a low level (hereinafter, referred to as "L") corresponding to the "0" data, the node INV is maintained at a high level (hereinafter, referred to as "H"), the transistor 40 is turned off, and the transistor 44 is turned on. Conversely, when the node LAT is at "H" corresponding to the "1" data, the node INV is maintained at "L," the transistor 40 is turned on, and the transistor 44 is turned off.

In the program operation, control signals HLL and XXL supplied to the gates of the transistors 45 and 46, respectively, are at "L," and the transistors 45 and 46 are turned off. Further, a control signal supplied to the transistor 41 is at "H," and the transistor 41 is turned on. In the normal program operation, the transistors 42 and 43 are turned on by control signals BLC and BLS.

Therefore, when the "0" data is stored in the node LAT, the transistor 40 is turned off and the transistor 44 is turned on to supply the bit line voltage Vbl_L such as the voltage VSS (e.g., 0 V) from the node SRC to the bit line BL. When the "1" data is stored in the node LAT, the transistor 40 is turned on and the transistor 44 is turned off to supply the bit line voltage Vbl_H (e.g., 2.5 V) according to the control signals BLC and BLS applied to the transistors 42 and 43.

In addition, in the present embodiment, in the pass write program operation, for a sense amplifier unit SAU connected to a bit line BL corresponding to a pass write cell, the node INV of the latch circuit SDL is set to "H." As a result, the transistor 40 is turned on. Further, the transistor 41 is also turned on by a control signal BLX. In this state, by appropriately setting the control signal BLC and the control signal BLS, a pass write voltage is supplied to the bit line BL by the transistors 42 and 43.

In the present embodiment, the controller 22 changes the pass write voltage by controlling the settings of the control signals BLC and BLS.

All of the transistors 40 to 48 and the capacitor 49 of the sense amplifier SA are involved in the verify operation. The drain-source path of the transistor 45 and the drain-source path of the transistor 46 are connected in series between the drain of the transistor 40 and the node COM. Further, the drain-source path of the transistor 48 and the drain-source path of the transistor 47 are connected in series between the bus LBUS and a reference voltage point. The source of the transistor 45 and the drain of the transistor 46 are connected to a sense node SEN, and the sense node SEN is connected to the gate of the transistor 47. The control signals HLL and XXL, the voltage of the sense node SEN, and a control signal STB are applied to each of the gates of the transistors 45 to 48. A clock CLK is applied to the sense node SEN via the capacitor 49.

Figure 17:
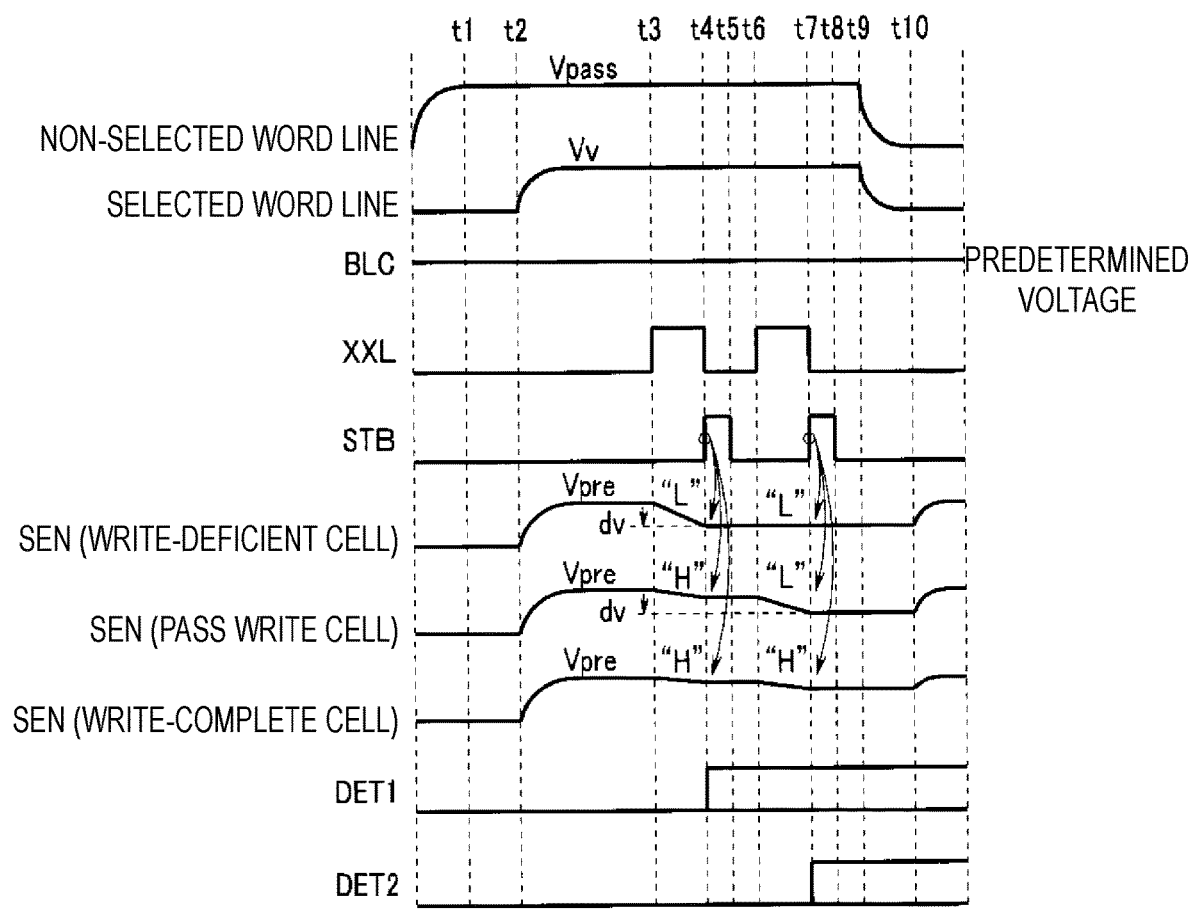
FIG. 17 is a view illustrating an operation waveform of the sense amplifier circuit of FIG. 16.

Next, the verify operation will be described with reference to FIG. 17. FIG. 17 is a view illustrating an operation waveform of the sense amplifier circuit 24 of FIG. 16.

First, the word line driver 25 applies a verify voltage Vv corresponding to the target state to a selected word line, and applies a read voltage Vpass (e.g., 5 V to 7 V) higher than the verify voltage Vv to a non-selected word line.

In the verify operation, the controller 22 first sets the node INV to "L" to turn on the transistor 40. In addition, the bit line BL is fixed at a predetermined voltage (e.g., 0.5 V) by turning on the transistor 41 by the control signal BLX and setting the control signal BLC and the control signal BLS to a predetermined voltage. Further, by setting the control signal HLL to a predetermined voltage, the sense node SEN is charged to a predetermined pre-charge voltage Vpre higher than the voltage of the bit line BL. In this state, when the control signal XXL is set to "H" (t3), a current flows from the sense node SEN to the bit line BL via the transistors 46, 42, and 43, and the voltage of the sense node SEN gradually decreases.

The voltage of the sense node SEN changes according to the state of the threshold voltage of a memory cell to be verified (selected memory cell). That is, when the threshold voltage of the selected memory cell is lower than the verify voltage Vv, the selected memory cell is turned on, a large cell current flows into the selected memory cell, and a speed at which the voltage of the sense node SEN decreases is increased. When the threshold voltage of the selected memory cell is higher than the verify voltage Vv, the selected memory cell is turned off, a small cell current flows into the selected memory cell or no cell current flows into the selected memory cell, and a speed at which the voltage of the sense node SEN decreases is decreased.

Therefore, at first time t4 when a first period elapses from discharge start time t3 at which the sense node SEN starts to be discharged, that is, at a time when the first period elapses after the control signal XXL is set to "H," when the control signal XXL is set to "L" and the control signal STB is set to "H" to turn on the transistor 48, the transistor 47 is turned on/off depending on whether the voltage of the sense node SEN is "L" or "H."

For example, when the selected memory cell is a write-deficient cell, the threshold voltage of the selected memory cell is lower than the verify voltage Vv, and the difference between the threshold voltage of the selected memory cell and the verify voltage Vv is large. Thus, the selected memory cell is completely turned on and a large cell current flows into the selected memory cell. As a result, the voltage of the sense node SEN rapidly decreases, and a voltage drop reaches dV before the time t4. At the time t4, the sense node SEN is at "L," and the transistor 47 is turned off to flow no current from the bus LBUS to the reference voltage point.

When the selected memory cell is a pass write cell, the threshold voltage of the selected memory cell is lower than the verify voltage Vv, and the difference between the threshold voltage of the selected memory cell and the verify voltage Vv is small. Thus, a small cell current flows into the selected memory cell. As a result, the voltage of the sense node SEN smoothly decreases, and a voltage drop does not reach dV before the time t4. At the time t4, the sense node SEN remains at a voltage corresponding to "H." Therefore, the transistor 47 is turned on to flow a current from the bus LBUS to the reference voltage point.

When the selected memory cell is a write-complete cell, the threshold voltage of the selected memory cell is higher than the verify voltage Vv. Thus, the selected memory cell is turned off, and a very small cell current flows into the selected memory cell or no cell current flows into the selected memory cell. As a result, the voltage of the sense node SEN very smoothly decreases, and a voltage drop does not reach dV before the time t4. At the time t4, the sense node SEN remains at "H." Therefore, the transistor 47 is turned on to flow a current from the bus LBUS to the reference voltage point.

In this way, first, it is possible to sort out write-deficient cells. In FIG. 17, DET1 represents a result of a detection of the level of the sense node SEN which is obtained according to whether or not a current flows into the bus LBUS at the first time t4, that is, a result of a detection on whether or not the threshold voltage exceeds the verify low level.

Thereafter, at t5 in FIG. 17, the control signal STB is set to a low level to turn off the transistor 48. Subsequently, at t6, the control signal XXL is set to "H" again. Next, at second time t7 when a second period (t6 to t7) elapses in addition to the first period (t3 to t4) in which the sense node SEN is discharged in the previous step, the control signal XXL is set to "L" and the control signal STB is set to "H" to turn on the transistor 48. As a result, the transistor 47 is turned on/off depending on whether the voltage of the sense node SEN is "L" or "H" at the second time t7.

For example, when the selected memory cell is a write-deficient cell, the voltage of the sense node SEN rapidly decreases, and a voltage drop already reaches dV before time t4. Thus, the sense node SEN is at "L" at the time t7 as well. As a result, the transistor 47 is turned off to flow no current from the bus LBUS to the reference voltage point.

When the selected memory cell is a pass write cell, the threshold voltage of the selected memory cell is lower than the verify voltage Vv, and the difference between the threshold voltage of the selected memory cell and the verify voltage Vv is small. Thus, a small cell current flows into the selected memory cell. As a result, the voltage of the sense node SEN smoothly decreases, and a voltage drop reaches dV before the time t7. At the time t7, the sense node SEN is at "L." Therefore, the transistor 47 is turned off to flow no current from the bus LBUS to the reference voltage point.

When the selected memory cell is a write-complete cell, the threshold voltage of the selected memory cell is higher than the verify voltage Vv. Thus, a very small cell current flows into the selected memory cell or no cell current flows into the selected memory cell. As a result, the voltage of the sense node SEN very smoothly decreases, and a voltage drop does not reach dV before the time t7. At the time t7 as well, the sense node SEN remains at "H." Therefore, the transistor 47 is turned on to flow a current from the bus LBUS to the reference voltage point.

In this way, it is possible to sort out pass write cells and write-complete cells. In FIG. 17, DET2 represents a result of a detection of the level of the sense node SEN which is obtained according to whether or not a current flows into the bus LBUS at the second time t7, that is, a result of a detection on whether the threshold voltage falls between the verify low level and the verify high level or exceeds the verify high level.

As illustrated in FIG. 17, for example, when both DET1 and DET2 are "L," the selected memory cell is recognized as a write-deficient cell. When DET1 is "H" and DET2 is "L," the selected memory cell is recognized as a pass write cell. When both DET1 and DET2 are "H," the selected memory cell is recognized as a write-complete cell.

The operation of the sense amplifier SA described above is merely illustrative. For example, in order to detect whether the threshold voltage of the selected memory cell exceeds the verify high level and the verify low level, for example, the word line driver 25 may continuously apply the verify voltage Vv corresponding to the target state and a verify voltage Vvlow slightly lower than the verify voltage Vv to the selected word line, and the sense amplifier SA may detect a current flowing into the selected memory cell in each verify voltage application period.

The controller 22 determines whether the selected memory cell is the write-deficient cell, the pass write cell, or the write-complete cell, and controls the sense amplifier circuit 24 based on a result of the determination to set a bit line voltage. In this case, in the pass write program operation, the controller 22 changes the pass write voltage according to the state, the loop and the like of the write target memory cell MT.

Figure 18:
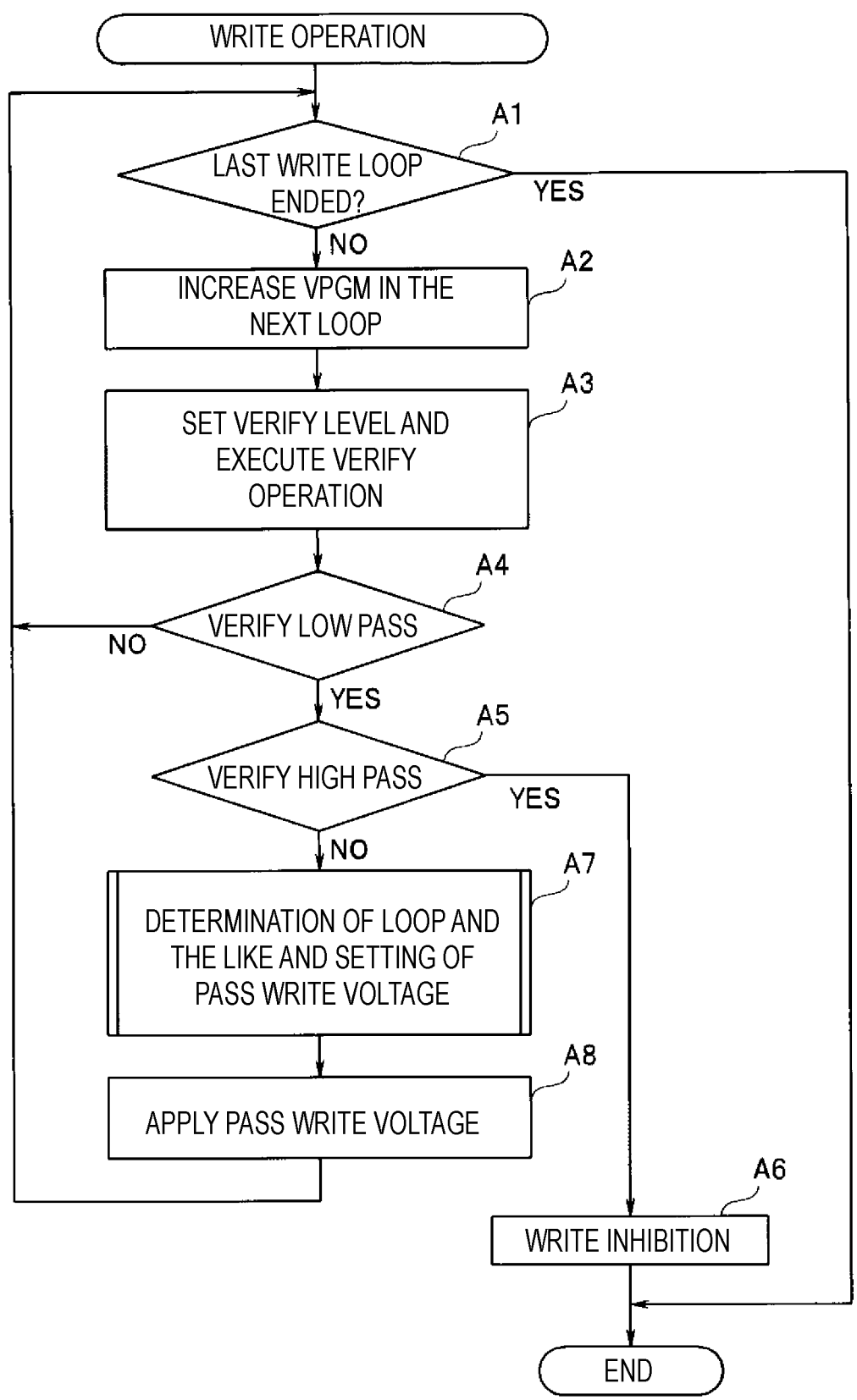
FIG. 18 is a flowchart for illustrating a control of a controller during a write operation.
Figure 19:
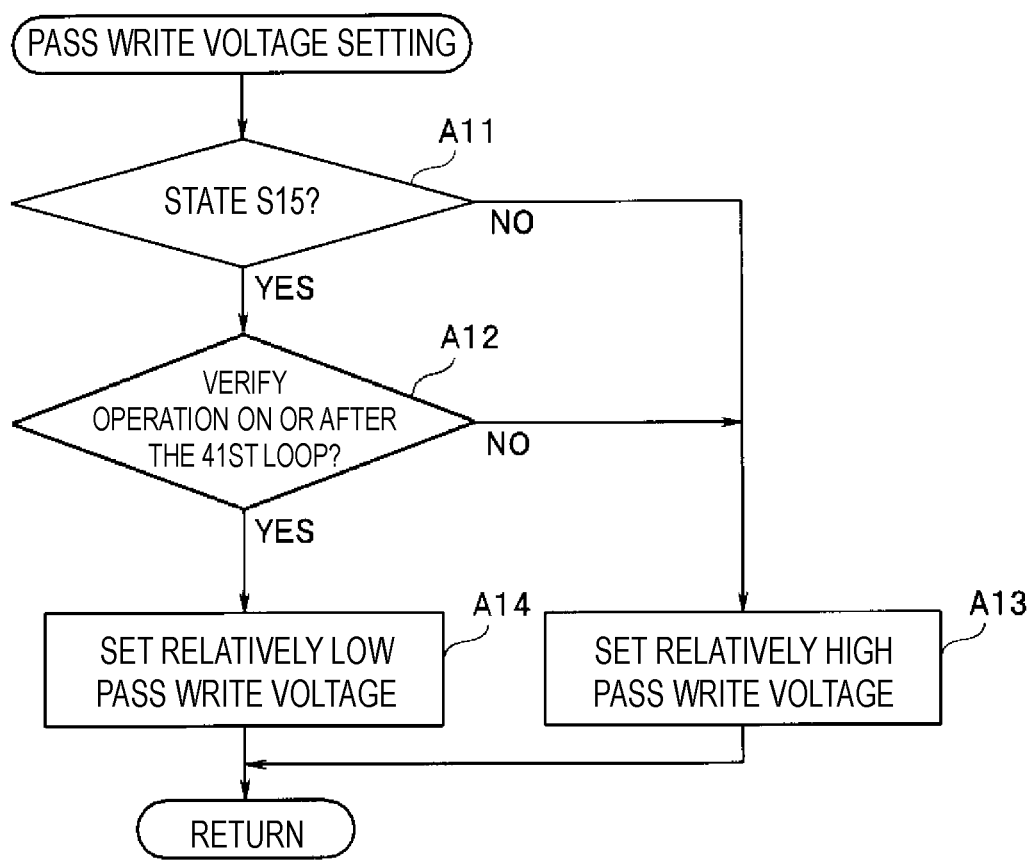
FIG. 19 is a flowchart for illustrating a control of a controller for pass write voltage setting.
Figure 20:
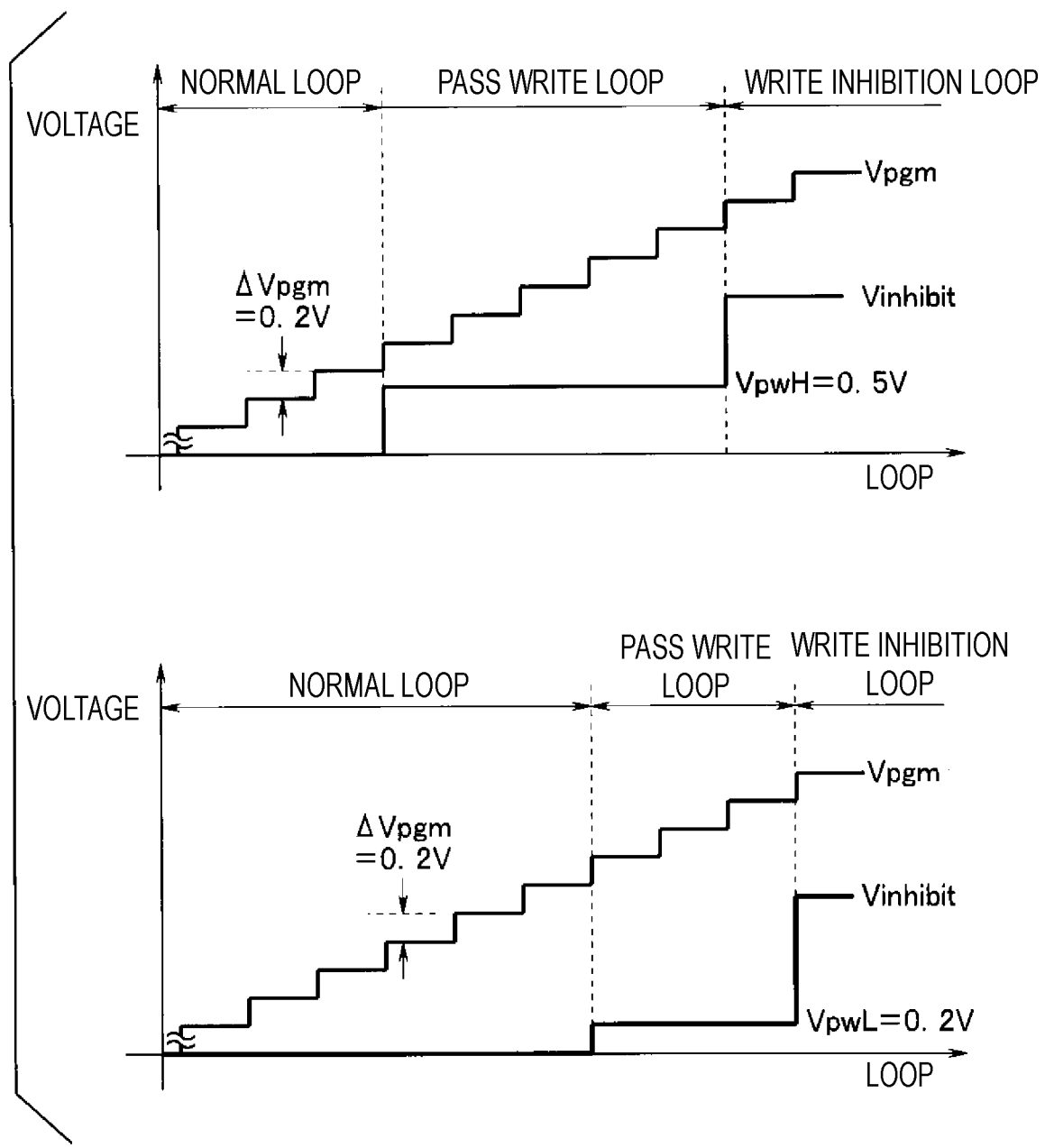
FIG. 20 illustrates the relationship among a program voltage, a bit line voltage, an effective program voltage, and a threshold voltage, during a write operation according to the first embodiment.
Figure 21:
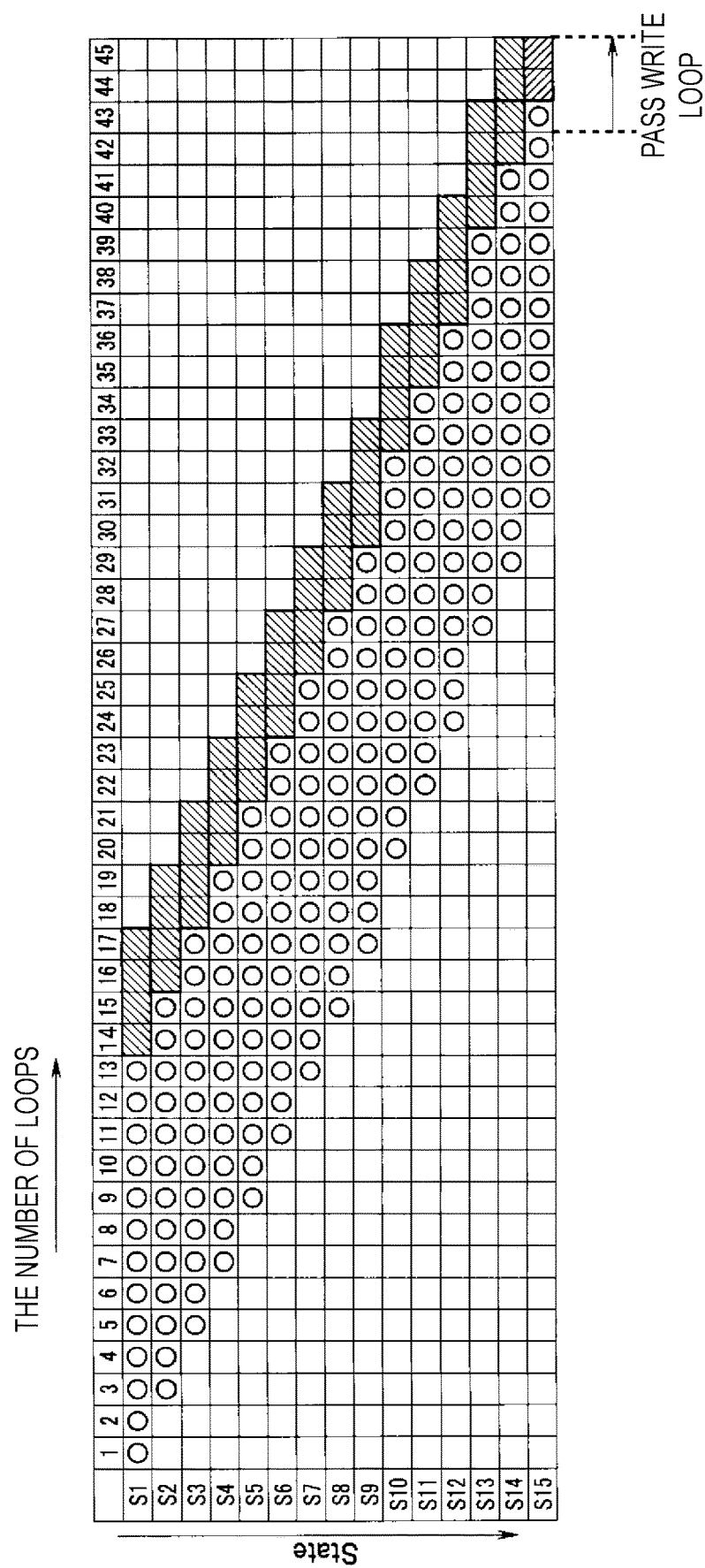
FIG. 21 is a view illustrating a write sequence according to the first embodiment.

Next, the operation of the embodiment configured as described above will be described with reference to FIGS. 18 to 21. FIGS. 18 and 19 are flowcharts for illustrating the control of the controller 22 during a write operation and for pass write voltage setting. FIG. 20 illustrates the relationship among the program voltage Vpgm, the bit line voltage, the effective program voltage, and the threshold voltage. FIG. 21 is a view illustrating the write sequence in the present embodiment. FIG. 20 is intended to explain the schematic relationship and does not provide accurate measurements.

FIG. 21 illustrates a write sequence corresponding to the standard write sequence of FIG. 8. That is, in FIG. 21 as well, when the pass write loop is not adopted, the write is performed by 43 loops of a combination of the program operation and the verify operation. Circles in FIG. 21 indicate a case where the pass write program operation is not adopted, that is, loops capable of the verify operation as in FIG. 8, and hatched portions indicate loops of the write operation increasing as a result of adopting the pass write program operation.

That is, in the present embodiment, there is a possibility that the write operation is performed up to the last loop of the hatched portion of each of the states S1 to S15. The program operation and the verify operation are performed in the last loop, but the program operation is not performed in the next loop, regardless of a result of the determination of the verify operation.

Also in the example of FIG. 21, as in the example of FIG. 8, various settings are performed such that it is expected that the threshold voltage of each memory cell MT exceeds the verify low level in a loop indicated by the second circle from the end of the sequence or the threshold voltage of each memory cell MT falls in the target range of the target state by continuing the normal program operation up to a loop indicated by the last circle in the sequence.

The controller 22 controls the word line driver 25 to increase the program voltage Vpgm for each loop. The amount of increase of the program voltage Vpgm is ΔVpgm (e.g., 0.2 V). After the program operation, in the loop of the circle and hatched portion of each state, the verify operation is performed with the verify low level and the verify high level as the determination criterion using the verify voltage according to the target state of each memory cell MT. In addition, as indicated by circles in FIG. 21, in each loop, after one program operation is performed, the verify operation is performed multiple times with verify voltages corresponding to different states indicated by circles.

The normal program operation is performed in the next loop for a memory cell MT determined to be the write-deficient cell by the verify operation, and the next loop is subjected to the write inhibition for a memory cell MT determined to be the write-complete cell by the verify operation. In the present embodiment, the pass write program operation is performed in the next loop for a memory cell MT determined to be the pass write cell by the verify operation.

In the standard write sequence of FIG. 8, the last verify operation indicated by a circle in each state only checks whether or not the threshold voltage reaches the target state, and the write operation is not performed in the next loop. However, in the pass write program operation, it cannot be expected that the threshold voltage reaches the target state with only one pass write loop. For this reason, as indicated by the hatched portions in FIG. 21, a loop of the write operation is performed additionally relative to the standard write sequence.

The write operation is performed according to the flow of FIG. 18. FIG. 18 illustrates a control for a predetermined write target memory cell MT. The controller first determines whether or not the last loop of the write operation set in the corresponding memory cell MT has ended (A1). When it is determined that the last loop of the write operation has not ended, the controller 22 proceeds to the next loop to increase the program voltage Vpgm and perform the program operation (A2). By this program operation, the threshold voltage of the memory cell MT is increased by the amount of increase of the effective program voltage.

Next, the controller 22 sets a verify voltage according to the target state of the target memory cell MT in the loop in which the program operation has been performed, and executes the verify operation with the verify low level and the verify high level corresponding to the set verify voltage as the determination criterion (A3). The controller 22 performs the verify determination from the output of the sense amplifier circuit 24 (A4 and A5). As a result of the verify operation, a case where the threshold voltage of the target memory cell MT reaches the verify low level is referred to as a verify low pass, and a case where the threshold voltage reaches the verify high level is referred to as a verify high pass.

The controller 22 determines the verify low pass and the verify high pass (A4 and A5). When it is determined that the verify low pass is not established, that is, when the threshold voltage of the target memory cell MT does not reach the verify low level, the controller 22 determines that the memory cell MT is a write-deficient cell, and returns the process to A1. Thus, when the last loop of the write operation has not ended, the write operation is performed in the next loop.

When it is determined by the verify operation that the verify low pass is established, that is, when the threshold voltage of the target memory cell MT reaches the verify high level, the controller 22 determines that the memory cell MT is a write-complete cell, and moves the process to A6 where the subsequent loops are set to the write inhibition.

When it is determined by the verify operation that the verify low pass is established and the verify low pass is not established, that is, when the threshold voltage of the target memory cell MT falls between the verify low level and the verify high level, the controller 22 determines that the memory cell MT is a pass write cell, and the process proceeds to A7. The controller 22 determines the current loop or the like, and sets a pass write voltage according to a result of the determination.

FIG. 19 illustrates a specific flow of A7 of FIG. 18. The controller 22 first determines whether or not the verify operation is for the memory cell MT in the state S15 (A11). When it is determined that the verify operation is not for the memory cell MT in the state S15, the controller 22 sets a relatively high pass write voltage (A13). For example, in the example of FIG. 21, the controller 22 sets a pass write voltage expected to reach the target state by the pass write program operation of five loops. The controller 22 controls the sense amplifier circuit 24 to apply the set pass write voltage to the bit line BL (A8 in FIG. 18).

The upper part of FIG. 20 represents an example of this case. That is, the upper part of FIG. 20 represents write into a memory cell MT of a state other than the state S15 of FIG. 21, which is determined to be a pass write cell by the verify operation in a loop before the second loop from the end of the sequence.

When it is determined by the verify operation in the last normal loop in the upper part of FIG. 20 that the memory cell MT is a pass write cell, the controller 22 sets a relatively high voltage VpwH (e.g., 0.5 V) as a pass write voltage in the next loop. As a result, as illustrated in FIG. 14, the rise of the threshold voltage is prevented, and thus, the threshold voltage reaches the target range of the target state by the pass write program operation of 5 loops. Then, the controller 22 sets the bit line voltage to the write inhibition voltage Vinhibit and inhibits the write (A6). By this control, the write is completed in 43 loops for the states S1 to S13, and the write is completed in 45 loops for the state S14. Also in this case, the width of the threshold voltage distribution can be made very narrow.

The number of loops in the pass write loop until the threshold voltage reaches the target range of the target state is an expected value corresponding to the pass write voltage, but in practice, for example, the threshold voltage may reach the target range of the target state with a smaller number of loops than the expected number of loops.

Meanwhile, when the verify operation is for the memory cell MT of the state S15, the controller 22 determines whether or not the corresponding verify operation was performed in a loop that is on or after the 42nd loop (A12). When it is determined that the verify operation is performed in a loop before the 41st loop, the controller 22 sets a relatively high pass write voltage (A13). That is, in this case, the pass write program operation illustrated in the upper part of FIG. 20 is performed. As a result, it is expected that the threshold voltage is to reach the target range of the target state in 5 loops, that is, by the 45th loop even at the latest.

Meanwhile, when the verify operation is performed in a loop of on or after the 41st loop, the controller 22 sets a relatively low pass write voltage (A14). For example, in the example of FIG. 21, the control unit 22 sets a pass write voltage expected to reach the target state by the pass write program operation of 3 loops.

The lower part of FIG. 20 represents an example of this case. That is, the lower part of FIG. 20 represents write of a memory cell MT determined to be the pass write cell by the verify operation in the 41st or 42nd loop of FIG. 21. When it is determined by the verify operation in the last normal loop in the lower part of FIG. 20 that the memory cell MT is a pass write cell, the controller 22 sets a relatively low voltage VpwL (e.g., 0.2 V) as a pass write voltage in the next loop. As a result, as illustrated in FIG. 14, the rise of the threshold voltage is prevented, and thus, the threshold voltage reaches the target range of the target state by the pass write program operation of 3 loops. Then, the controller 22 sets the bit line voltage to the write inhibition voltage Vinhibit and inhibits the write (A6). By this control, the write is completed for the memory cell MT of the state S15 by the 45th loop even at the latest. In this case as well, the width of the threshold voltage distribution can be made relatively narrow. The period of the pass write loop illustrated in FIG. 21 indicates the pass write program period of the memory cell MT of the state S15 determined to be the pass write cell by the verify operation in the 42nd loop.

In a case of performing the write operation in which the threshold voltage reaches the target range of the target loop by the five pass write program operations simply using the pass write effect in the standard write sequence by the 43 loops illustrated in FIG. 8, the entire sequence requires 47 loops. Meanwhile, in the present embodiment, the amount of the pass write effect is controlled according to the loop so that the entire sequence can be reduced to 45 loops.

In this manner, in the present embodiment, the width of the threshold voltage distribution can be narrowed by performing the write operation using the pass write effect. In addition, the amount of the pass write effect is controlled by changing the pass write voltage according to the state and the loop, so that the number of loops required in the entire sequence can be reduced to prevent an increase in the total time required for the write operation.

Although an example in which the pass write voltage is switched in two steps has been described in the above embodiment, the pass write voltage may be switched in three or more steps.

Second Embodiment

Figure 22:
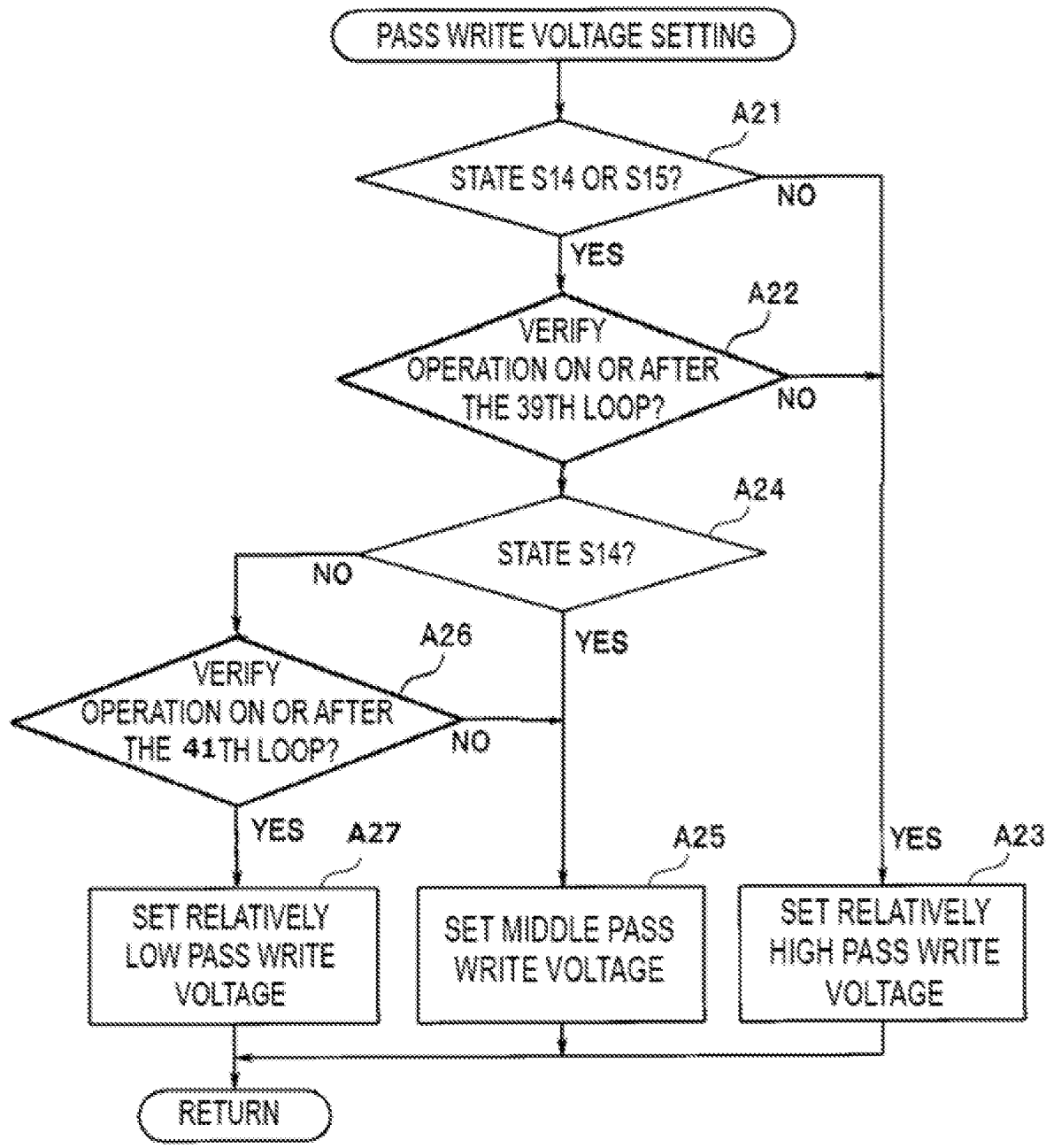
FIG. 22 is a flowchart for illustrating a method of pass write voltage setting according to a second embodiment.
Figure 23:
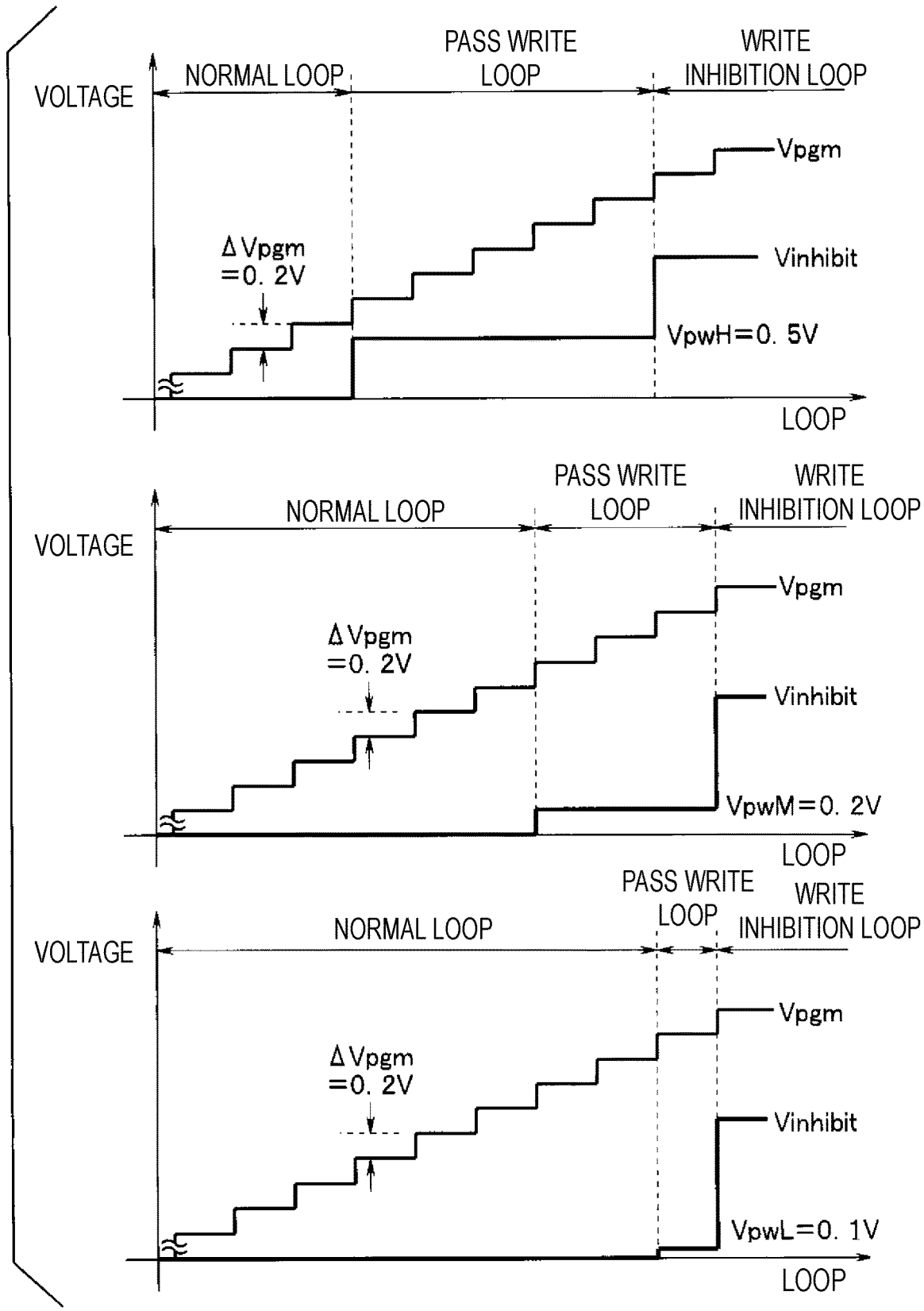
FIG. 23 illustrates the relationship among the program voltage, the bit line voltage, the effective program voltage, and the threshold voltage, during a write operation according to the second embodiment.
Figure 24:
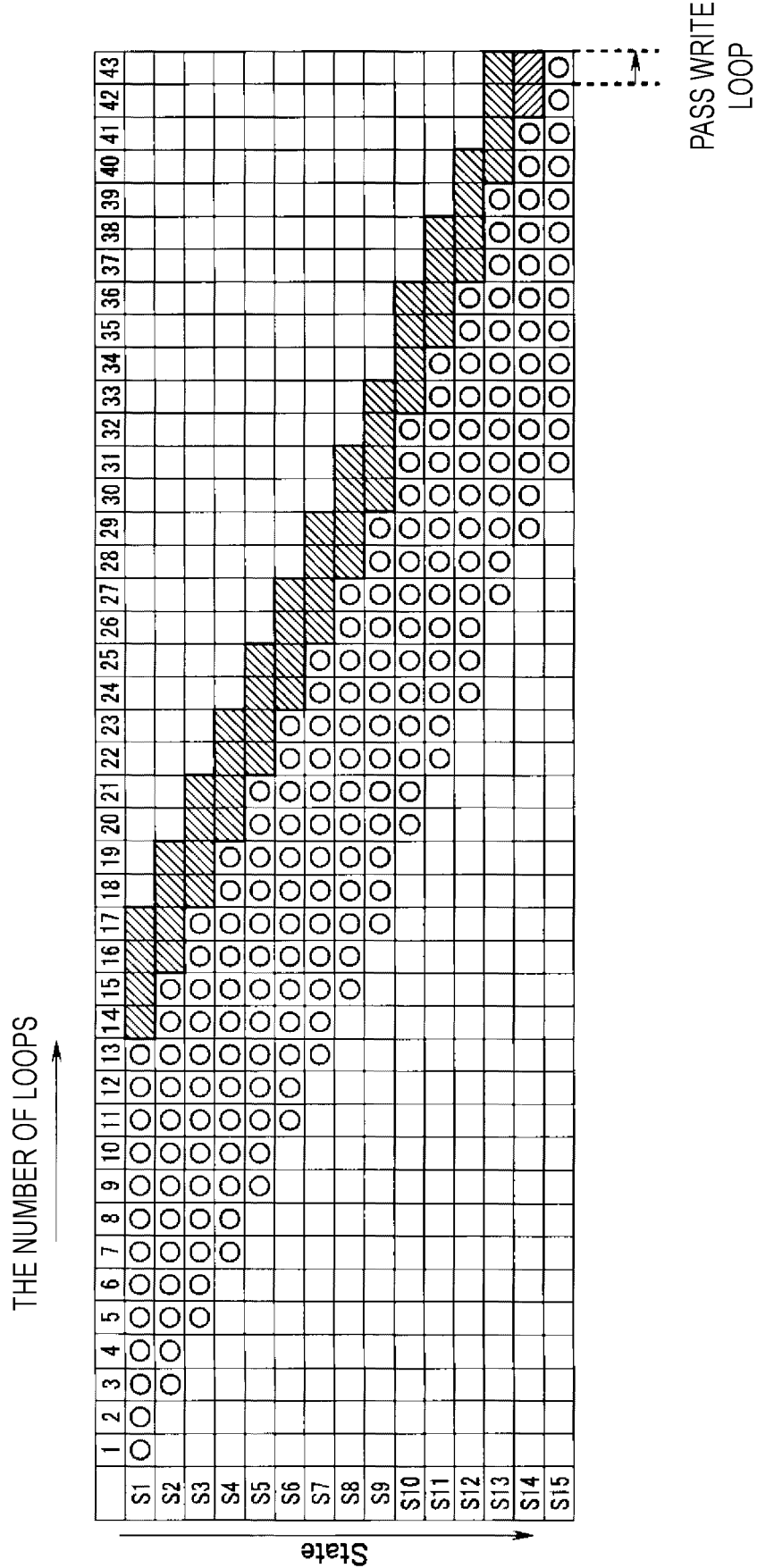
FIG. 24 is a view illustrating a write sequence according to the second embodiment.

FIGS. 22 to 24 are views illustrating a second embodiment of the present disclosure. The second embodiment has the same hardware configuration as the first embodiment. The second embodiment differs from the first embodiment in the control of the write operation by the controller 22.

FIG. 22 is a flowchart for illustrating the control of the controller 22 for pass write voltage setting. FIG. 23 illustrates the relationship among the program voltage Vpgm, the bit line voltage, the effective program voltage, and the threshold voltage, and FIG. 24 is a view illustrating a write sequence in the second embodiment. FIG. 23 is described by the same notation as in FIG. 20. Further, FIG. 24 is described by the same notation as in FIG. 21, and circle marks and hatched portions in the figure have the same meanings as in FIG. 21.

That is, also in the present embodiment, when the pass write program operation is not adopted, the write operation is performed in the same sequence as that of FIG. 8. As illustrated in FIG. 24, the present embodiment is to limit the number of loops required for the write operation to 43 as in FIG. 8.

Also in the second embodiment, the operation flow of FIG. 18 is adopted in the write operation. FIG. 22 illustrates a specific flow of A7 of FIG. 18.

The controller 22 first determines whether or not the verify operation is for memory cells MT of the states S14 and S15 (A21). When it is determined that the verify operation is for memory cells MT of the states S14 and S15, the controller 22 determines whether or not the verify operation is performed in a loop on or after the 39th loop (A22). When it is determined that the verify operation is not for memory cells MT of the states S14 and S15, or when the verify operation is for memory cell MT of the states S14 and S15 but is not performed in a loop before the 39th loop, the control unit 22 moves the process to A23 to set a relatively high pass write voltage (A23). For example, in the example of FIG. 24, the controller 22 sets a pass write voltage expected to reach the target state by the pass write program operation of 5 loops.

The upper part of FIG. 23 represents an example of this case. That is, the upper part of FIG. 23 represents write into memory cells MT of the states S1 to S13 or memory cells MT of the states S14 and S15, which are determined to be pass write cells by the verify operation in a loop on or before the 38th loop of the sequence of FIG. 24.

When it is determined by the verify operation in the last normal loop in the upper part of FIG. 23 that the memory cells MT are pass write cells, the controller 22 sets a relatively high voltage VpwH (e.g., 0.5 V) as a pass write voltage in the next loop. As a result, as illustrated in FIG. 14, the rise of the threshold voltage is prevented, and thus, the threshold voltage reaches the target range of the target state by the pass write program operation of 5 loops. Then, the controller 22 sets the bit line voltage to the write inhibition voltage Vinhibit and inhibits the write (A6). By this control, the write is completed in 43 loops for the memory cells MT of the states S1 to S13 and the memory cells MT of the states S1 to S13 determined to be pass write cells by the verify operation in a loop on or before the 38th loop. In this case as well, the width of the threshold voltage distribution can be made very narrow.

When it is determined that the verify operation is for the memory cells MT of the states S14 and S15 and is performed in a loop on or after the 39th loop, the controller 22 determines whether or not the verify operation is for the memory cell MT of the state S14 (A24). When it is determined that the verify operation is for the memory cell MT of the state S14, the controller 22 sets a middle pass write voltage (A25). For example, in the example of FIG. 24, the controller 22 sets a pass write voltage expected to reach the target state by the pass write program operation of 3 loops.

The middle part of FIG. 23 represents an example of this case. That is, the middle part of FIG. 23 represents write into the memory cell MT of the state S14 determined to be a pass write cell by the verify operation in a loop on or after the 39th loop in the sequence of FIG. 24.

When it is determined by the verify operation in the last normal loop in the middle part of FIG. 23 that the memory cell is the pass write cell, the controller 22 sets a middle voltage VpwM (for example 0.2 V) as a pass write voltage in the next loop. As a result, as illustrated in FIG. 14, the rise of the threshold voltage is prevented, and thus, the threshold voltage reaches the target range of the target state by the pass write program operation of 3 loops. Then, the controller 22 sets the bit line voltage to the write inhibition voltage Vinhibit and inhibits the write (A6). By this control, the write is completed in 43 loops for the memory cell MT of the state S14 determined to be the pass write cell by the verify operation of a loop on or after the 39th. In this case as well, the width of the threshold voltage distribution can be made relatively narrow.

When it is determined that the verify operation is for the memory cell MT of the state S15 (A24, No) and is performed in a loop on or after the filth loop (A26, Yes), the controller 22 sets a relatively low pass write voltage (A27). On the other hand, when it is determined that the verify operation is for the memory cell MT of the state S15 (A24, No) and is performed in a loop before the filth loop (A26, No), the controller 22 sets the middle pass write voltage (A25). For example, in the example of FIG. 24, the controller 22 sets a pass write voltage expected to reach the target state by the pass write program operation of one loop.

The lower part of FIG. 23 represents an example of this case. That is, the lower part of FIG. 23 represents write of the memory cell MT of the state S15 determined to be the pass write cell by the verify operation in a loop on or after the filth loop in the sequence of FIG. 24.

When it is determined by the verify operation in the last normal loop in the lower part of FIG. 23 that the memory cell MT is a pass write cell, the controller 22 sets a relatively low voltage VpwL as a pass write voltage in the next loop. For example, the voltage Vpwl is set to a value (e.g., 0.1 V) smaller than $\Delta$Vpgm. As a result, although the rise of the threshold voltage is similar to that during the QPW operation, the threshold voltage reaches the target range of the target state by the pass write program operation of 1 loop. By this control, the write is completed in 43 loops for the memory cell MT of the state S15 determined to be the pass write cell by the verify operation in a loop on or after the 39th loop. The period of the pass write loop illustrated in FIG. 24 indicates the pass write program period of the memory cell MT of the state S15 determined to be the pass write cell by the verify operation in the 42nd loop.

In this manner, the second embodiment can also achieve the same effects as the first embodiment. Further, in the second embodiment, the write can be completed with the same number of loops as in a case where write using the path write effect is not performed, so that the width of the threshold voltage distribution can be narrowed while preventing an increase in the total time required for the write operation.

Third Embodiment

Figure 25:
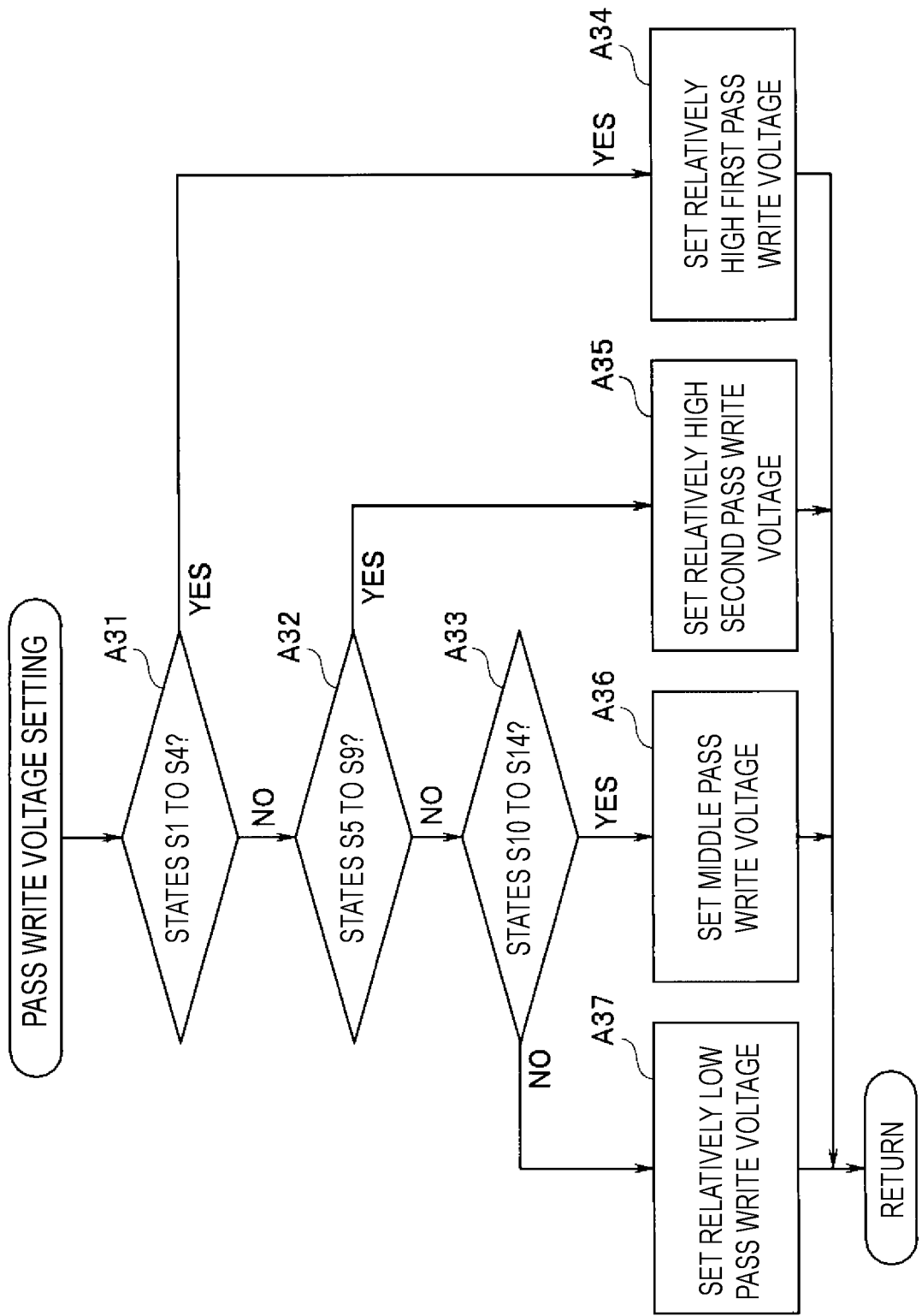
FIG. 25 is a flowchart for illustrating a method of pass write voltage setting according to a third embodiment.
Figure 26:
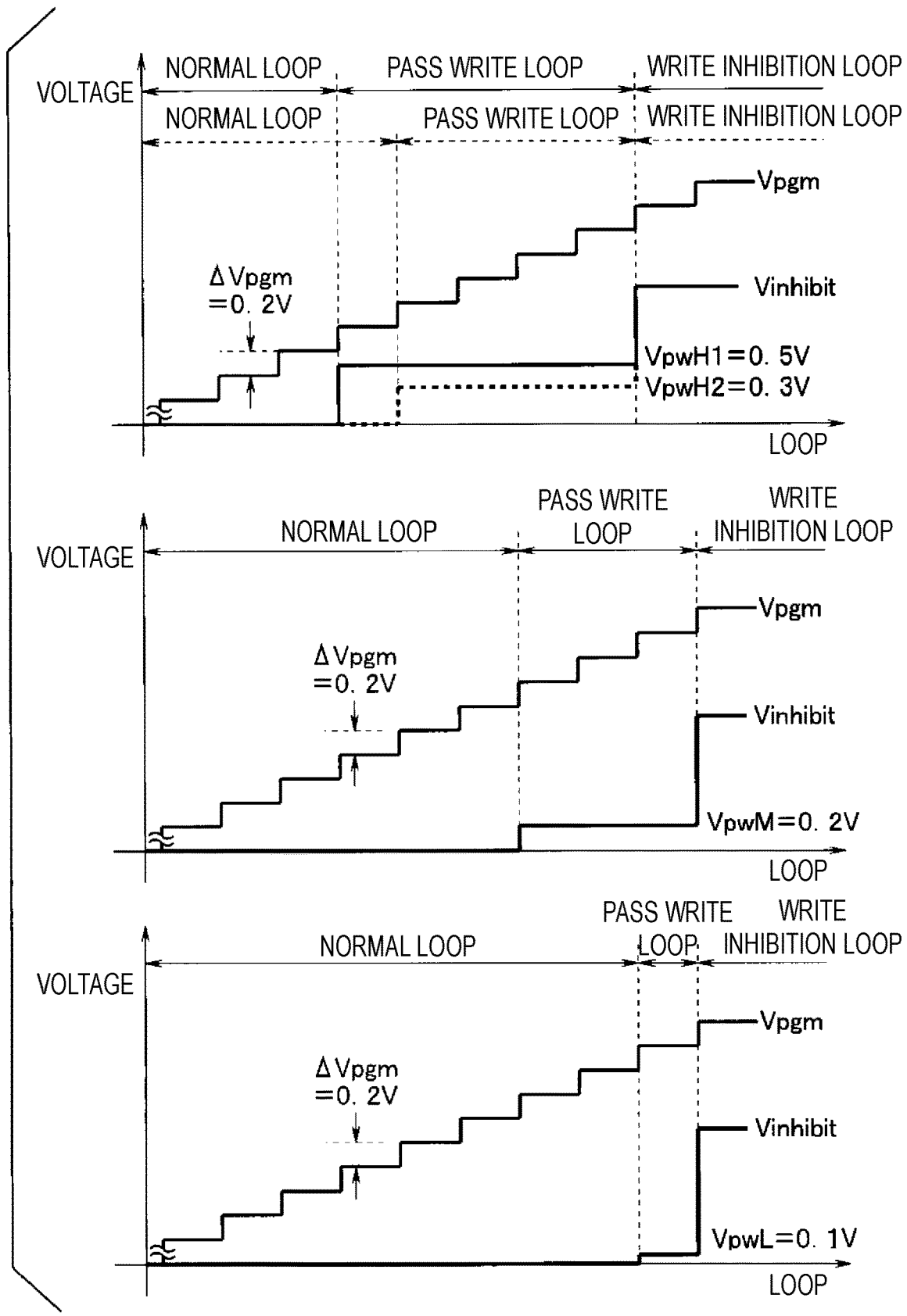
FIG. 26 the relationship among the program voltage, the bit line voltage, the effective program voltage, and the threshold voltage, during a write operation according to the third embodiment.
Figure 27:
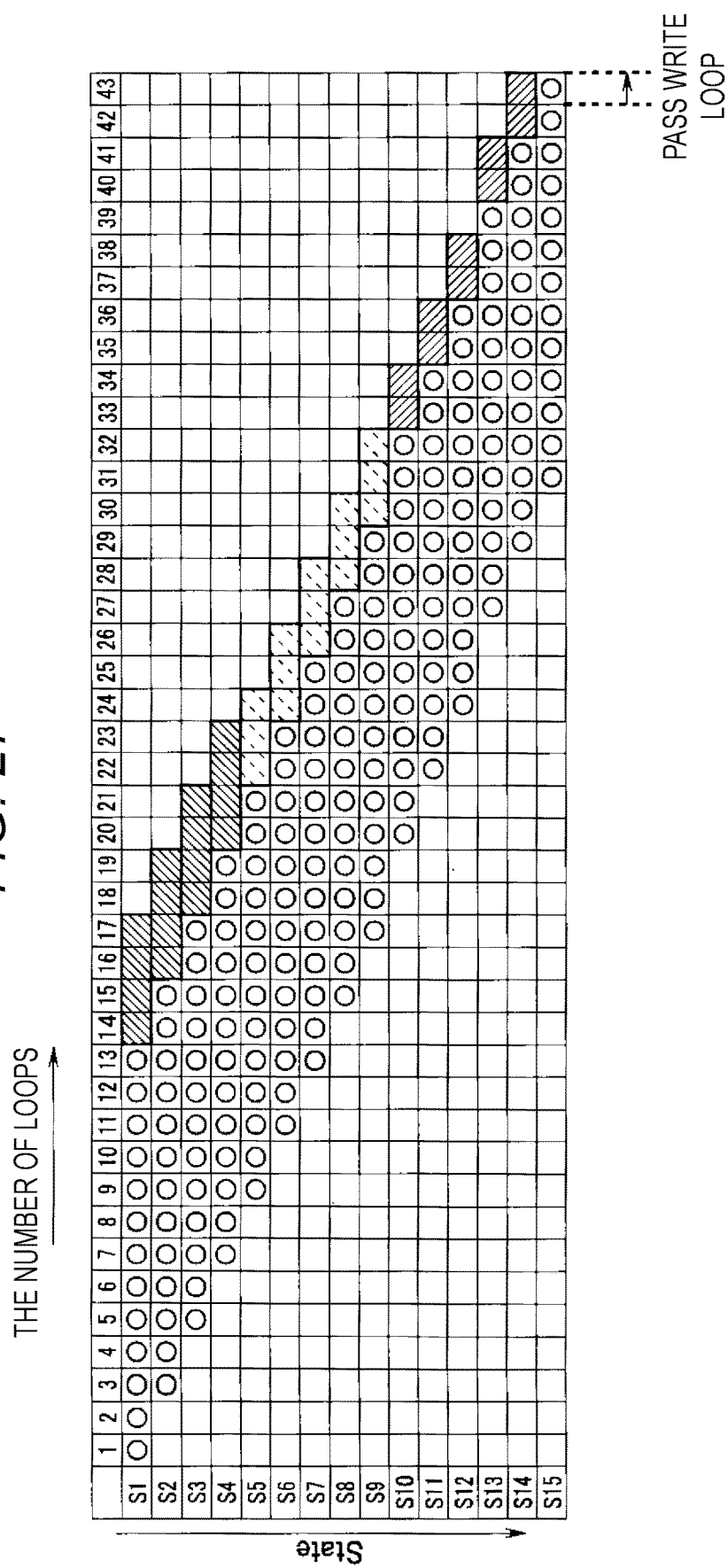
FIG. 27 is a view illustrating a write sequence according to the third embodiment.

FIGS. 25 to 27 are views illustrating a third embodiment of the present disclosure. The third embodiment has the same hardware configuration as the first embodiment. The third embodiment differs from the second embodiment in the control of the write operation by the controller 22.

FIG. 25 is a flowchart for illustrating the control of the controller 22 for pass write voltage setting. FIG. 26 illustrates the relationship among the program voltage Vpgm, the bit line voltage, the effective program voltage, and the threshold voltage, and FIG. 27 is a view illustrating a write sequence in the third embodiment. FIG. 26 is described by the same notation as in FIG. 20. Further, FIG. 27 is described by the same notation as in FIG. 21, and circle marks and hatched portions (including broken/hatched portions) in the figure have the same meanings as in FIG. 21.

That is, also in the present embodiment, when the pass write program operation is not adopted, the write operation is performed in the same sequence as that of FIG. 8. As illustrated in FIG. 27, the present embodiment is to change the amount of the pass write effect according to the state.

Also in the present embodiment, the operation flow of FIG. 18 is adopted in the write operation. FIG. 25 illustrates a specific flow of A7 of FIG. 18.

The controller 22 determines whether or not the verify operation is for memory cells MT of the states S1 to S4, whether or not the verify operation is for memory cells MT of the states S5 to S9, and whether or not the verify operation is for memory cells MT of the states S10 to S14 (A31 to A33).

When it is determined that the verify operation is for the memory cells MT of the states S1 to S4, the controller 22 sets a first relatively high pass write voltage (A34). When it is determined that the verify operation is for the memory cells MT of the states S5 to S9, the controller 22 sets a second relatively high pass write voltage (A35). When it is determined that the verify operation is for the memory cells MT of the states S10 to S14, the controller 22 sets a middle pass write voltage (A36). When it is determined that the verify operation is for the memory cell MT of the state S15, the controller 22 sets a relatively low pass write voltage (A37).

For example, in the example of FIG. 27, the controller 22 sets a pass write voltage VpwH1 expected to reach the target state by the pass write program operation of 5 loops, as the first relatively high pass write voltage. In addition, for example, in the example of FIG. 27, the controller 22 sets a pass write voltage VpwH2 expected to reach the target state by the pass write program operation of 4 loops, as the second relatively high pass write voltage. In addition, for example, in the example of FIG. 27, the controller 22 sets a pass write voltage VpwM expected to reach the target state by the pass write program operation of 3 loops, as the middle pass write voltage. In addition, for example, in the example of FIG. 27, the controller 22 sets a pass write voltage VpwL expected to reach the target state by the pass write program operation of 1 loop, as the relatively low pass write voltage. The voltage VpwL is set to a value smaller than ΔVpgm.

The upper part of FIG. 26 represents the pass write program operation by the first relatively high pass write voltage VpwH1 by a solid line, and represents the pass write program operation by the second relatively high pass write voltage VpwH2 by a dashed line. When it is determined by the verify operation in the last normal loop in the upper part of FIG. 26 that the memory cells MT of the states S1 to S4 are pass write cells, the controller 22 sets a relatively high voltage VpwH1 (e.g., 0.5 V) as a pass write voltage in the next loop. As a result, as illustrated in FIG. 14, the rise of the threshold voltage is prevented, and thus, the threshold voltage reaches the target range of the target state by the pass write program operation of 5 loops. In this case, the width of the threshold voltage distribution can be made very narrow.

In addition, when it is determined by the verify operation in the last normal loop in the upper part of FIG. 26 that the memory cells MT of the states S5 to S9 are pass write cells, the controller 22 sets a relatively high voltage VpwH2 (e.g., 0.3 V) as a pass write voltage in the next loop. As a result, as illustrated in FIG. 14, the rise of the threshold voltage is prevented, and thus, the threshold voltage reaches the target range of the target state by the pass write program operation of 4 loops. In this case as well, the width of the threshold voltage distribution can be made very narrow.

The middle part of FIG. 26 represents the pass write program operation by the pass write voltage VpwM. When it is determined by the verify operation in the last normal loop in the middle part of FIG. 26 that the memory cells MT of the states S10 to S14 are pass write cells, the controller 22 sets a middle voltage VpwM (e.g., 0.2 V) as a pass write voltage in the next loop. As a result, as illustrated in FIG. 14, the rise of the threshold voltage is prevented, and thus, the threshold voltage reaches the target range of the target state by the pass write program operation of 3 loops. In this case, the width of the threshold voltage distribution can be made sufficiently narrow.

The lower part of FIG. 26 represents the pass write program operation by the pass write voltage VpwL. When it is determined by the verify operation in the last normal loop in the lower part of FIG. 26 that the memory cell MT of the state S15 is a pass write cell, the controller 22 sets a relatively low voltage VpwL (e.g., 0.1 V) as a pass write voltage in the next loop. As a result, the threshold voltage reaches the target range of the target state by the pass write program operation of 1 loop. In this case, although the effect of reducing the width of the threshold voltage distribution is small, the write operation can be performed in fewer loops. As a result, the write can be completed in 43 loops similar to FIG. 8.

In this manner, the third embodiment can also achieve the same effects as in the first and second embodiments. Further, in the third embodiment, the number of loops required for the threshold voltage to reach the target range of the target state can be reduced by changing the amount of the path write effect for each loop. As a result, the effect of reducing the verify operation is obtained.

Fourth Embodiment

Figure 28:
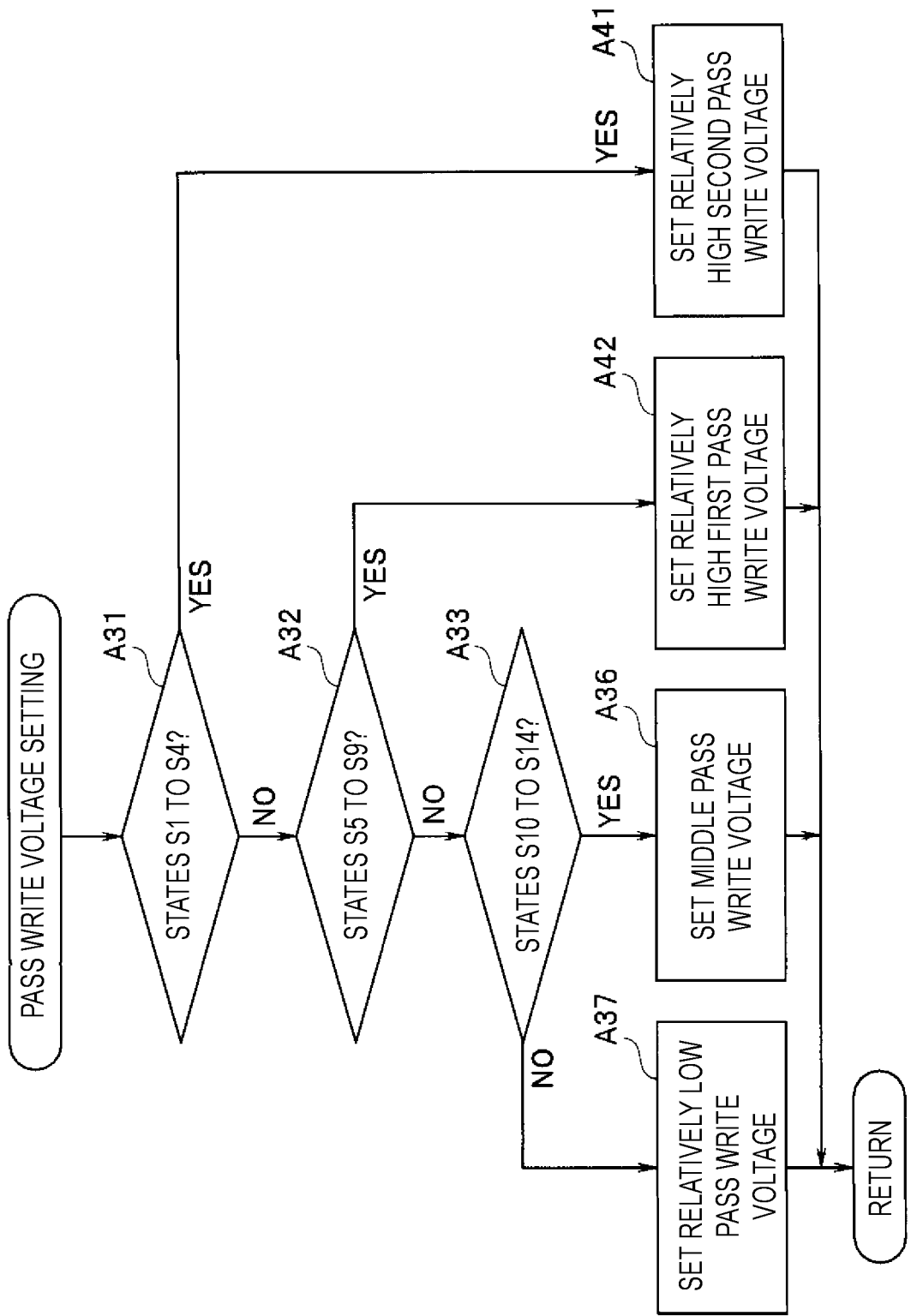
FIG. 28 is a flowchart for illustrating a method of pass write voltage setting according to a fourth embodiment.
Figure 29:
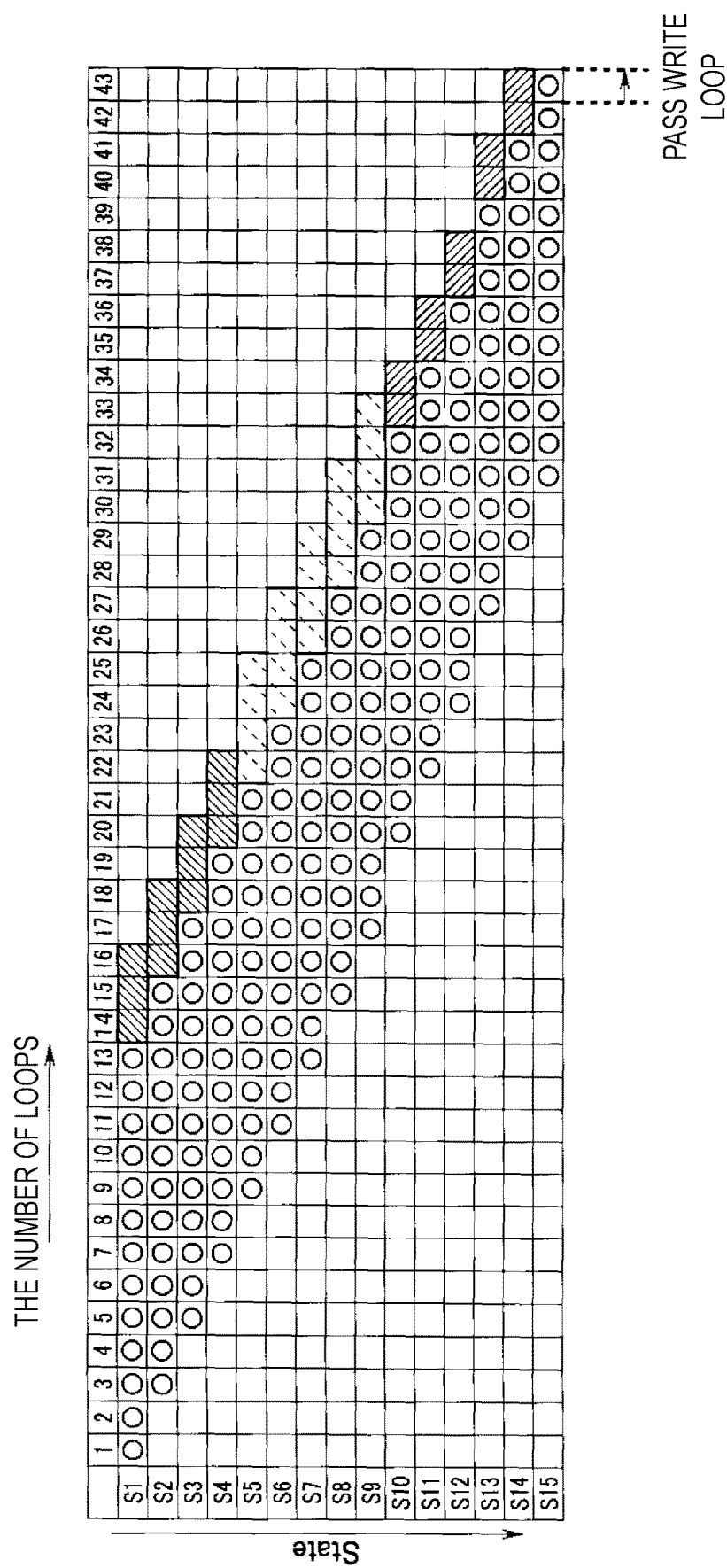
FIG. 29 is a view illustrating a write sequence according to the fourth embodiment.

FIGS. 28 and 29 are views illustrating a fourth embodiment of the present disclosure. The fourth embodiment has the same hardware configuration as the first embodiment. The fourth embodiment differs from the third embodiment in the control of the write operation by the controller 22.

FIG. 28 is a flowchart for illustrating the control of the controller 22 for pass write voltage setting. FIG. 29 is a view illustrating a write sequence in the fourth embodiment. FIG. 29 is described by the same notation as in FIG. 21, and circle marks and hatched portions (including broken/hatched portions) in the figure have the same meanings as in FIG. 21.

That is, also in the present embodiment, when the pass write program operation is not adopted, the write operation is performed in the same sequence as that of FIG. 8. As illustrated in FIG. 29, the present embodiment is to change the amount of the pass write effect according to the state.

Also in the present embodiment, the operation flow of FIG. 18 is adopted in the write operation. FIG. 28 illustrates a specific flow of A7 of FIG. 18. In FIG. 28, the same steps as those in FIG. 25 will be denoted by the same reference numerals as used in FIG. 25, and descriptions thereof will be omitted.

When it is determined that the verify operation is for the memory cells MT of the states S1 to S4, the controller 22 sets a second relatively high pass write voltage (A41). When it is determined that the verify operation is for the memory cells MT of the states S5 to S9, the controller 22 sets a first relatively high pass write voltage (A42).

For example, in the example of FIG. 29, the controller 22 sets, as the first relatively high pass write voltage, a pass write voltage VpwH1 expected to reach the target state by the pass write program operation of 5 loops. In addition, for example, in the example of FIG. 29, the controller 22 sets, as the second relatively high pass write voltage, a pass write voltage VpwH2 expected to reach the target state by the pass write program operation of 4 loops.

That is, the fourth embodiment differs from the third embodiment in that, for the memory cells MT of the states S1 to S4, the threshold voltage reaches the target range of the target state by the pass write program operation of 4 loops, and, for the memory cells MT of the states S5 to S9, the threshold voltage reaches the target range of the target state by the pass write program operation of 5 loops. The other operations are the same as those of the third embodiment.

In this manner, the fourth embodiment can also achieve the same effects as in the first to third embodiments.

Fifth Embodiment

Figure 30:
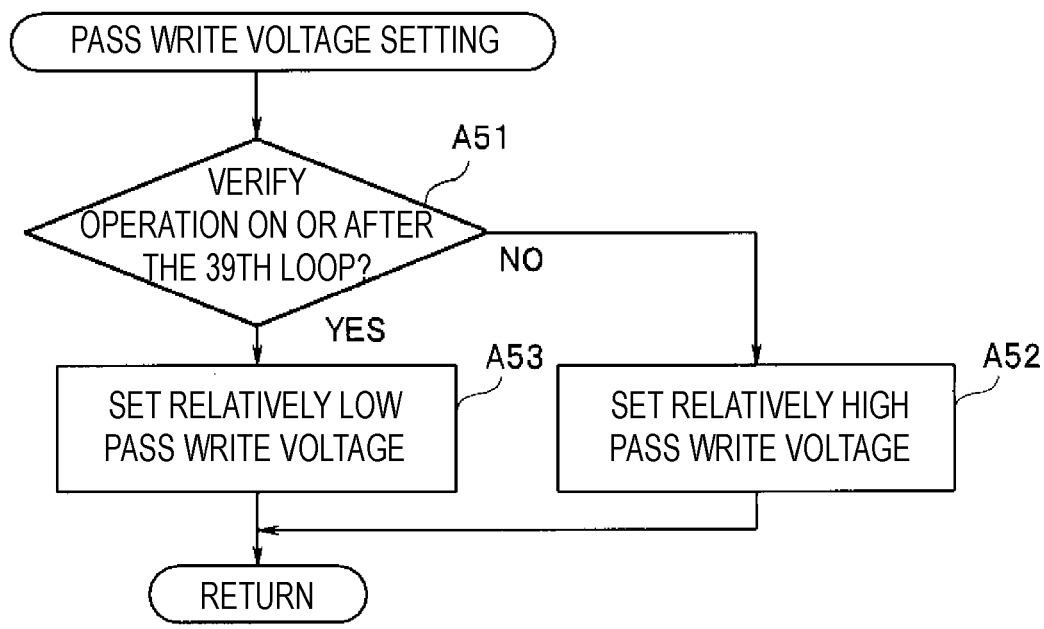
FIG. 30 is a flowchart for illustrating a method of pass write voltage setting according to a fifth embodiment of the present disclosure.

FIG. 30 is a flowchart for illustrating a method of pass write voltage setting according to a fifth embodiment of the present disclosure. The fifth embodiment has the same hardware configuration as the first embodiment. The fifth embodiment differs from the second embodiment in the control of the write operation by the controller 22.

FIG. 30 is a flowchart for illustrating the control of the controller 22. The fifth embodiment has the same write sequence as FIG. 24 in the second embodiment. That is, also in the fifth embodiment, when the pass write program operation is not adopted, the write operation is performed in the same sequence as that of FIG. 8.

An example of controlling the pass write voltage according to the state and the loop has been illustrated in the first and second embodiments, and an example of controlling the pass write voltage according to the state has been illustrated in the third and fourth embodiments. The fifth embodiment illustrates an example of controlling the pass write voltage according to the loop.

Also in the present embodiment, the operation flow of FIG. 18 is adopted in the write operation. FIG. 30 illustrates a specific flow of A7 of FIG. 18.

The controller 22 determines whether or not the verify operation is performed in a loop on or after the 39th loop (A51). When it is determined that the verify operation is performed in a loop before the 39th loop, the controller 22 sets a relatively high pass write voltage (A52). When it is determined that the verify operation is performed in a loop on or after the 39th loop, the controller 22 sets a relatively low pass write voltage (A53).

For example, in the example of FIG. 24, the controller 22 sets, as the relatively high pass write voltage, a pass write voltage expected to reach the target state by the pass write program operation of 5 loops. In addition, for example, in the example of FIG. 24, the controller 22 sets, as the relatively low pass write voltage, a pass write voltage expected to reach the target state by the pass write program operation of 1 loop. For example, this relatively low pass write voltage is set to a value smaller than $\Delta Vpgm$.

That is, according to the present embodiment, when the verify operation is performed in a loop before the 39th loop, the threshold voltage reaches the target range of the target state by the pass write program operation of 5 loops. As a result, the width of the threshold voltage distribution can be narrowed sufficiently, and the write can be completed up to the 43rd loop even at the latest.

When the verify operation is performed in a loop on or after the 39th loop, the threshold voltage reaches the target range of the target state by the pass write program operation of 1 loop. As a result, although the width of the threshold voltage distribution cannot be narrowed sufficiently, the write can be completed up to the 43rd loop even at the latest.

In this manner, the fifth embodiment can also achieve the same effects as in the second embodiment.

Sixth Embodiment

Figure 31:
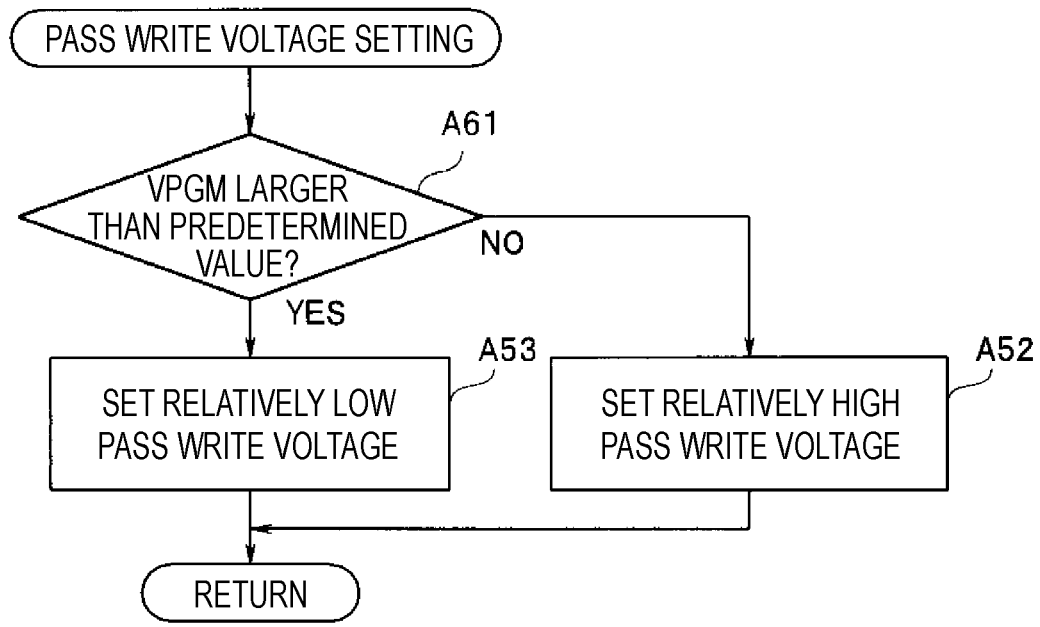
FIG. 31 is a flowchart for illustrating a method of pass write voltage setting according to a sixth embodiment of the present disclosure.

FIG. 31 is a flowchart for illustrating a method of pass write voltage setting according to a sixth embodiment of the present disclosure. The sixth embodiment has the same hardware configuration as the first embodiment. The sixth embodiment differs from the fifth embodiment in the control of the write operation by the controller 22.

FIG. 31 is a flowchart for illustrating the control of the controller 22. In FIG. 31, the same steps as those in FIG. 30 will be denoted by the same reference numerals as used in FIG. 30, and descriptions thereof will be omitted. The sixth embodiment has the same write sequence as FIG. 24 in the second embodiment. That is, also in the sixth embodiment, when the pass write program operation is not adopted, the write operation is performed in the same sequence as that of FIG. 8.

An example of controlling the pass write voltage according to the loop has been described in the fifth embodiment. The program voltage Vpgm in each loop is previously defined. Therefore, instead of the determination of the loop, the program voltage Vpgm may be determined.

FIG. 31 differs from FIG. 30 only in that the program voltage Vpgm is compared to a predetermined value (A61). That is, the controller 22 determines from the program voltage Vpgm whether or not the verify operation is performed in a loop before the 39th loop. According to a result of the comparison, the controller 22 sets a relatively high pass write voltage when the program voltage Vpgm is not larger than the predetermined value (A52), and sets a relatively low pass write voltage when the program voltage Vpgm is larger than the predetermined value (A53).

The other operations and effects are the same as those of the fifth embodiment.

In this manner, the sixth embodiment can also achieve the same effects as in the fifth embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a memory cell array including a plurality of memory cells;
   a word line connected to gates of the plurality of memory cells;
   a word line driver configured to apply a program voltage to the word line during a program operation of a write operation to write data into the plurality of memory cells and to apply a verify voltage to the word line during a verify operation of the write operation;
   a plurality of bit lines connected to the plurality of memory cells, respectively;
   a sense amplifier circuit configured to apply a bit line voltage to the plurality of bit lines during the program operation and to detect the data written into the plurality of memory cells via the plurality of bit lines during the verify operation; and
   a control circuit configured to control the word line driver and the sense amplifier circuit to execute the write operation in a plurality of loops executed in sequence, the program voltage being increased for each subsequent loop of the write operation, wherein
   when writing first data into a target memory cell connected to the word line, the control circuit executes at least first and second loops in the sequence, and
   in executing the first loop, the control circuit applies a first program voltage to the word line during the program operation, and applies a verify voltage corresponding to the first data to the word line during the verify operation, and
   upon detecting that the verify operation in the first loop neither passed nor failed, the control circuit selects one of at least two pass write voltages to be applied to the bit line connected to the target memory cell during the program operation of the second loop according to a sequential position of the first loop in the sequence of the plurality of loops.

2. The semiconductor memory device according to claim 1, wherein
   the at least two pass write voltages are greater than a ground voltage and less than a pass voltage that is applied to bit lines connected to memory cells that have passed the verify operation.

3. The semiconductor memory device according to claim 2, wherein
   the at least two pass write voltages include a first pass write voltage and a second pass write voltage greater than the first pass write voltage, and upon detecting that the verify operation in the first loop neither passed nor failed, the control circuit selects the first pass write voltage to be applied to the bit line connected to the target memory cell during the program operation of the second loop when the sequential position of the first loop in the sequence of the plurality of loops is one of the last three loops in the sequence of the plurality of loops.

4. The semiconductor memory device according to claim 3, wherein
upon detecting that the verify operation in the first loop neither passed nor failed, the control circuit selects the second pass write voltage to be applied to the bit line connected to the target memory cell during the program operation of the second loop when the sequential position of the first loop in the sequence of the plurality of loops is not one of the last three loops in the sequence of the plurality of loops.

5. The semiconductor memory device according to claim 2, wherein
the at least two pass write voltages include a first pass write voltage and a second pass write voltage greater than the first pass write voltage, and a third pass write voltage greater than the second pass write voltage, and
upon detecting that the verify operation in the first loop neither passed nor failed, the control circuit selects the first or second pass write voltage to be applied to the bit line connected to the target memory cell during the program operation of the second loop when the sequential position of the first loop in the sequence of the plurality of loops is one of the last three loops in the sequence of the plurality of loops.

6. The semiconductor memory device according to claim 5, wherein
when writing second data into the target memory cell connected to the word line, the control circuit executes the first and second loops in the sequence and at least one loop in the sequence that is earlier in the sequence than any of the loops executed when writing the first data, and
upon detecting that the verify operation in the first loop neither passed nor failed, the control circuit selects the first pass write voltage to be applied to the bit line connected to the target memory cell during the program operation of the second loop when writing the first data and the sequential position of the first loop in the sequence of the plurality of loops is one of the last three loops in the sequence of the plurality of loops, and selects the second pass write voltage to be applied to the bit line connected to the target memory cell during the program operation of the second loop when writing the second data and the sequential position of the first loop in the sequence of the plurality of loops is one of the last three loops in the sequence of the plurality of loops.

7. The semiconductor memory device according to claim 6, wherein
upon detecting that the verify operation in the first loop neither passed nor failed, the control circuit selects the third pass write voltage to be applied to the bit line connected to the target memory cell during the program operation of the second loop when the sequential position of the first loop in the sequence of the plurality of loops is not one of the last three loops in the sequence of the plurality of loops.

8. A semiconductor memory device comprising:
a memory cell array including a plurality of memory cells;
a word line connected to gates of the plurality of memory cells;
a word line driver configured to apply a program voltage to the word line during a program operation of a write operation to write data into the plurality of memory cells, and to apply a verify voltage to the word line during a verify operation of the write operation;
a plurality of bit lines connected to the plurality of memory cells, respectively;
a sense amplifier circuit configured to apply a bit line voltage to the plurality of bit lines during the program operation and to detect the data written into the plurality of memory cells via the plurality of bit lines during the verify operation; and
a control circuit configured to control the word line driver and the sense amplifier circuit to execute the write operation in a plurality of loops executed in sequence, the program voltage being increased for each subsequent loop of the write operation, wherein
when writing data into a target memory cell connected to the word line, the control circuit executes at least first and second loops in the sequence, and
in executing the first loop, the control circuit applies a first program voltage to the word line during the program operation to increase a threshold voltage of the target memory cell to a target threshold voltage range, and applies a verify voltage corresponding to the data to the word line during the verify operation, and
upon detecting that the verify operation in the first loop neither passed nor failed, the control circuit selects one of at least two pass write voltages to be applied to the bit line connected to the target memory cell during the program operation of the second loop according to the target threshold voltage range.

9. The semiconductor memory device according to claim 8, wherein
the at least two pass write voltages are greater than a ground voltage and less than a pass voltage that is applied to bit lines connected to memory cells that have passed the verify operation.

10. The semiconductor memory device according to claim 9, wherein
the at least two pass write voltages include a first pass write voltage and a second pass write voltage greater than the first pass write voltage, and
upon detecting that the verify operation in the first loop neither passed nor failed, the control circuit selects the first pass write voltage to be applied to the bit line connected to the target memory cell during the program operation of the second loop when the target threshold voltage range is higher than any threshold voltage range associated with other data that can be written into the memory cells.

11. The semiconductor memory device according to claim 10, wherein
upon detecting that the verify operation in the first loop neither passed nor failed, the control circuit selects the second pass write voltage to be applied to the bit line connected to the target memory cell during the program operation of the second loop when the target threshold voltage range is lower than any threshold voltage range associated with other data that can be written into the memory cells.

12. The semiconductor memory device according to claim 9, wherein
  the at least two pass write voltages include a first pass write voltage and a second pass write voltage greater than the first pass write voltage, and a third pass write voltage greater than the second pass write voltage, and
  upon detecting that the verify operation in the first loop neither passed nor failed, the control circuit selects the first or second pass write voltage to be applied to the bit line connected to the target memory cell during the program operation of the second loop when the target threshold voltage range is higher than at least one threshold voltage range associated with other data that can be written into the memory cells.

13. The semiconductor memory device according to claim 12, wherein
  upon detecting that the verify operation in the first loop neither passed nor failed, the control circuit selects the first pass write voltage to be applied to the bit line connected to the target memory cell during the program operation of the second loop when the target threshold voltage range is a first target threshold voltage range, selects the second pass write voltage to be applied to the bit line connected to the target memory cell during the program operation of the second loop when the target threshold voltage range is a second target threshold voltage range that is lower than the first target threshold voltage range, and selects the third pass write voltage to be applied to the bit line connected to the target memory cell during the program operation of the second loop when the target threshold voltage range is a third target threshold voltage range that is lower than the second target threshold voltage range.

14. The semiconductor memory device according to claim 9, wherein
  the at least two pass write voltages include a first pass write voltage, a second pass write voltage greater than the first pass write voltage, a third pass write voltage greater than the second pass write voltage, and a fourth pass write voltage greater than the third pass write voltage, and
  upon detecting that the verify operation in the first loop neither passed nor failed, the control circuit selects the third or fourth pass write voltage to be applied to the bit line connected to the target memory cell during the program operation of the second loop when the target threshold voltage range is lower than at least one threshold voltage range associated with other data that can be written into the memory cells.

15. The semiconductor memory device according to claim 14, wherein
  upon detecting that the verify operation in the first loop neither passed nor failed, the control circuit selects the third pass write voltage to be applied to the bit line connected to the target memory cell during the program operation of the second loop when the target threshold voltage range is a first target threshold voltage range, and selects the fourth pass write voltage to be applied to the bit line connected to the target memory cell during the program operation of the second loop when the target threshold voltage range is a second target threshold voltage range that is lower than the first target threshold voltage range.

16. The semiconductor memory device according to claim 14, wherein
  upon detecting that the verify operation in the first loop neither passed nor failed, the control circuit selects the third pass write voltage to be applied to the bit line connected to the target memory cell during the program operation of the second loop when the target threshold voltage range is a first target threshold voltage range, and selects the fourth pass write voltage to be applied to the bit line connected to the target memory cell during the program operation of the second loop when the target threshold voltage range is a second target threshold voltage range that is higher than the first target threshold voltage range.

17. A semiconductor memory device comprising:
  a memory cell array including a plurality of memory cells;
  a word line connected to gates of the plurality of memory cells;
  a word line driver configured to apply a program voltage to the word line during a program operation of a write operation to write data into the plurality of memory cells, and to apply a verify voltage to the word line during a verify operation of the write operation;
  a plurality of bit lines connected to the plurality of memory cells, respectively;
  a sense amplifier circuit configured to apply a bit line voltage to the plurality of bit lines during the program operation and to detect the data written into the plurality of memory cells via the plurality of bit lines during the verify operation; and
  a control circuit configured to control the word line driver and the sense amplifier circuit to execute the write operation in a plurality of loops executed in sequence, the program voltage being increased for each subsequent loop of the write operation, wherein
  when writing data into a target memory cell connected to the word line, the control circuit executes at least first and second loops in the sequence, and
  in executing the first loop, the control circuit applies a first program voltage to the word line during the program operation to increase a threshold voltage of the target memory cell to a target threshold voltage range, and applies a verify voltage corresponding to the data to the word line during the verify operation, and
  upon detecting that the verify operation in the first loop neither passed nor failed, the control circuit selects one of at least two pass write voltages to be applied to the bit line connected to the target memory cell during the program operation of the second loop according to a second program voltage to be applied during the word line during the program operation of the second loop.

18. The semiconductor memory device according to claim 17, wherein
  the at least two pass write voltages are greater than a ground voltage and less than a pass voltage that is applied to bit lines connected to memory cells that have passed the verify operation.

19. The semiconductor memory device according to claim 18, wherein
  the at least two pass write voltages include a first pass write voltage and a second pass write voltage greater than the first pass write voltage, and
  upon detecting that the verify operation in the first loop neither passed nor failed, the control circuit selects the first pass write voltage to be applied to the bit line connected to the target memory cell during the program operation of the second loop when the second program voltage to be applied during the word line during the program operation of the second loop exceeds a predetermined level.

20. The semiconductor memory device according to claim 19, wherein
upon detecting that the verify operation in the first loop neither passed nor failed, the control circuit selects the second pass write voltage to be applied to the bit line connected to the target memory cell during the program operation of the second loop when the second program voltage to be applied during the word line during the program operation of the second loop does not exceed the predetermined level.

* * * * *